United States Patent
Kim et al.

(10) Patent No.: US 11,917,873 B2
(45) Date of Patent: Feb. 27, 2024

(54) DISPLAY DEVICE

(71) Applicant: SAMSUNG DISPLAY CO., LTD., Yongin-si (KR)

(72) Inventors: Byung Sun Kim, Yongin-si (KR); Sun Ja Kwon, Yongin-si (KR); Yang Wan Kim, Yongin-si (KR); Hyun Ae Park, Yongin-si (KR); Su Jin Lee, Yongin-si (KR); Jae Yong Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/137,742

(22) Filed: Dec. 30, 2020

(65) Prior Publication Data

US 2021/0134933 A1 May 6, 2021

Related U.S. Application Data

(63) Continuation of application No. 15/453,794, filed on Mar. 8, 2017, now Pat. No. 10,886,354.

(30) Foreign Application Priority Data

May 19, 2016 (KR) ........................ 10-2016-0061638

(51) Int. Cl.
*G09G 3/3266* (2016.01)
*H01L 27/12* (2006.01)
(Continued)

(52) U.S. Cl.
CPC ......... *H10K 59/131* (2023.02); *G09G 3/3233* (2013.01); *H10K 59/124* (2023.02);
(Continued)

(58) Field of Classification Search
CPC .... H01L 27/3258–3276; G09G 3/3233; G09G 2300/043; G09G 2300/0809–0861; G09G 2310/0291
See application file for complete search history.

(56) References Cited

U.S. PATENT DOCUMENTS

| | | | |
|---|---|---|---|
| 7,646,019 B2 | 1/2010 | Kimura | |
| 7,675,233 B2 | 3/2010 | Lee | |

(Continued)

FOREIGN PATENT DOCUMENTS

| | | |
|---|---|---|
| CN | 103247660 | 8/2013 |
| CN | 104022122 | 9/2014 |

(Continued)

OTHER PUBLICATIONS

Office Action dated Jun. 28, 2018 In Corresponding U.S. Appl. No. 15/453,794.

(Continued)

*Primary Examiner* — Lin Li
(74) *Attorney, Agent, or Firm* — F. Chau & Associates, LLC

(57) ABSTRACT

A display device includes a substrate having a pixel area and a peripheral area, a plurality of pixels disposed on the substrate in the pixel area, a plurality of data lines that supply a plurality of data signals to the pixels, a plurality of scan lines that supply a plurality of scan signals to the pixels, a plurality of power supply lines that supply a first voltage to the pixels, and first through third insulating layers. The first insulating layer is disposed on the substrate, the second insulating layer is disposed on the first insulating layer, and the third insulating layer is disposed on the second insulating layer. The scan lines are disposed below the third insulating layer on the substrate in the pixel area, and are disposed on the third insulating layer in the peripheral area.

14 Claims, 10 Drawing Sheets

(51) Int. Cl.
*H10K 59/80* (2023.01)
*G06F 3/044* (2006.01)
*G02F 1/1339* (2006.01)
*G02F 1/1362* (2006.01)
*H10K 59/131* (2023.01)
*G09G 3/3233* (2016.01)
*H10K 59/124* (2023.01)

(52) U.S. Cl.
CPC ........... *G09G 2300/043* (2013.01); *G09G 2300/0809* (2013.01); *G09G 2300/0819* (2013.01); *G09G 2300/0842* (2013.01); *G09G 2300/0861* (2013.01); *G09G 2310/0291* (2013.01)

(56) References Cited

U.S. PATENT DOCUMENTS

| | | | |
|---|---|---|---|
| 7,821,040 B2 | 10/2010 | Seong et al. | |
| 8,138,999 B2 | 3/2012 | Yamamoto et al. | |
| 8,153,531 B2 | 4/2012 | Jung et al. | |
| 9,231,000 B2 | 1/2016 | Ko et al. | |
| 9,691,345 B2 | 6/2017 | Park et al. | |
| 9,735,219 B2 | 8/2017 | An et al. | |
| 9,761,731 B2 | 9/2017 | Long et al. | |
| 10,088,724 B2 | 10/2018 | Zhang et al. | |
| 10,134,912 B2 | 11/2018 | Kimura et al. | |
| 2003/0122982 A1* | 7/2003 | Shin | G02F 1/136286 349/43 |
| 2006/0145606 A1 | 7/2006 | Lee | |
| 2007/0045626 A1* | 3/2007 | Murade | G02F 1/1345 257/59 |
| 2007/0103410 A1 | 5/2007 | Oh | |
| 2007/0114530 A1 | 5/2007 | Kimura | |
| 2008/0230767 A1 | 9/2008 | Jung et al. | |
| 2008/0291349 A1 | 11/2008 | Kim et al. | |
| 2009/0072298 A1 | 3/2009 | Choi et al. | |
| 2009/0102758 A1* | 4/2009 | Anzai | G09G 3/3266 345/76 |
| 2009/0167647 A1 | 7/2009 | Yamamoto et al. | |
| 2010/0302495 A1* | 12/2010 | Jeong | G02F 1/1339 349/153 |
| 2012/0099036 A1 | 4/2012 | Chang | |
| 2012/0105344 A1* | 5/2012 | Ko | G06F 3/0446 345/173 |
| 2013/0120231 A1 | 5/2013 | Jo et al. | |
| 2014/0049449 A1 | 2/2014 | Park et al. | |
| 2014/0175977 A1* | 6/2014 | Yoon | H10K 59/131 315/51 |
| 2014/0232007 A1 | 8/2014 | Kasai et al. | |
| 2014/0239270 A1 | 8/2014 | Ko et al. | |
| 2015/0008400 A1* | 1/2015 | Kim | H01L 51/5234 438/34 |
| 2015/0187279 A1* | 7/2015 | Lee | H10K 59/805 438/23 |
| 2016/0005992 A1 | 1/2016 | Song et al. | |
| 2016/0035284 A1* | 2/2016 | Jung | G06F 1/1637 345/82 |
| 2016/0035814 A1 | 2/2016 | Jin et al. | |
| 2016/0054836 A1 | 2/2016 | Wu et al. | |
| 2016/0155859 A1 | 6/2016 | Kimura et al. | |
| 2016/0187752 A1 | 6/2016 | Zhang et al. | |
| 2016/0190166 A1* | 6/2016 | Kim | H01L 27/124 257/71 |
| 2016/0291378 A1* | 10/2016 | Li | G02F 1/133514 |
| 2016/0293771 A1 | 10/2016 | Long et al. | |
| 2017/0337873 A1 | 11/2017 | Kim et al. | |

FOREIGN PATENT DOCUMENTS

| | | |
|---|---|---|
| CN | 104253159 | 12/2014 |
| CN | 104536226 | 4/2015 |
| JP | 2006-235612 | 9/2006 |
| JP | 2009-157019 | 7/2009 |
| JP | 2011-017821 | 1/2011 |
| KR | 10-2006-0080505 | 7/2006 |
| KR | 10-2008-0049551 | 6/2008 |
| KR | 10-0836472 | 6/2008 |
| KR | 10-2011-0025604 | 3/2011 |
| KR | 10-2014-0024191 | 2/2014 |
| KR | 10-2014-0108023 | 9/2014 |
| KR | 10-1605008 | 3/2016 |

OTHER PUBLICATIONS

Office Action dated Oct. 30, 2018 In Corresponding U.S. Appl. No. 15/453,794.
Final Office Action dated Apr. 9, 2019 in Corresponding U.S. Appl. No. 15/453,794.
Final Office Action dated Dec. 4, 2019 in Corresponding U.S. Appl. No. 15/453,794.
Office Action dated Mar. 10, 2020 in Corresponding U.S. Appl. No. 15/453,794.
Notice of Allowance dated Aug. 25, 2020 in Corresponding U.S. Appl. No. 15/453,794.
Notice of Allowance dated Dec. 2, 2020 in Corresponding U.S. Appl. No. 15/453,794.

* cited by examiner

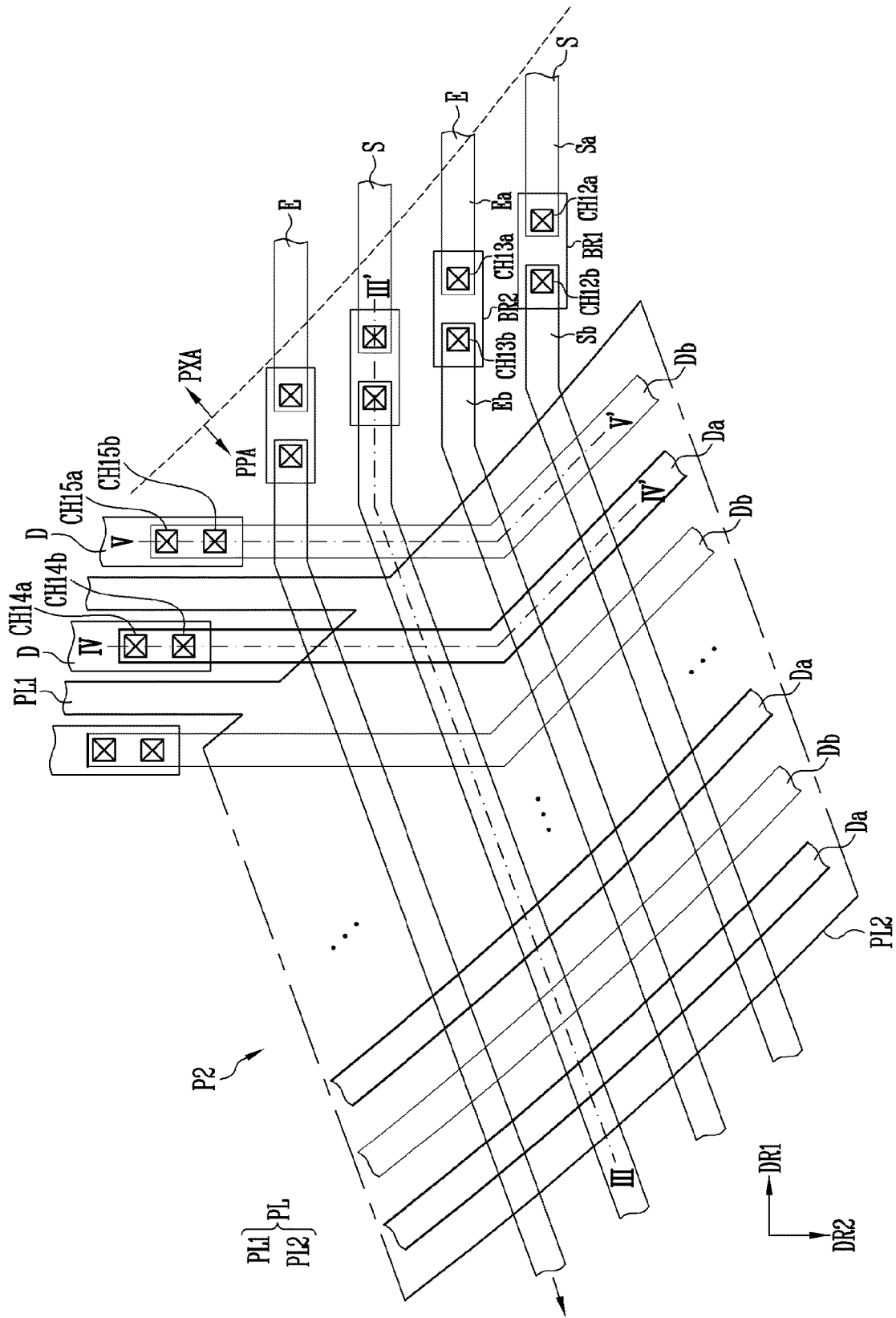

DISPLAY DEVICE

CROSS-REFERENCE TO RELATED APPLICATIONS

This application is a continuation application of U.S. patent application Ser. No. 15/453,794 filed Mar. 8, 2017, which claims priority under 35 U.S.C. § 119 to Korean Patent Application No. 10-2016-0061638, filed on May 19, 2016, the disclosures of which are incorporated by reference herein in their entirety.

TECHNICAL FIELD

Exemplary embodiments of the present inventive concept relate to a display device.

DISCUSSION OF THE RELATED ART

An organic light emitting device may include two electrodes and an organic light emitting layer located between the two electrodes. Electrons injected from one of the two electrodes and holes injected from the other electrode may be combined in the organic light emitting layer to form excitons. As the excitons emit energy, the organic light emitting device may emit light.

The organic light emitting device may include a plurality of pixels including organic light emitting devices. Wiring lines may be provided to each pixel to supply various signals thereto. These wiring lines may be disposed in various manners to supply signals to each pixel.

SUMMARY

According to an exemplary embodiment of the inventive concept, a display device includes a substrate including a pixel area and a peripheral area, a plurality of pixels disposed on the substrate in the pixel area, a plurality of data lines that supply a plurality of data signals to the pixels, a plurality of scan lines that supply a plurality of scan signals to the pixels, a plurality of power supply lines that supply a first voltage to the pixels, and first through third insulating layers. The first insulating layer is disposed on the substrate, the second insulating layer is disposed on the first insulating layer, and the third insulating layer is disposed on the second insulating layer. The scan lines are disposed below the third insulating layer on the substrate in the pixel area, and are disposed on the third insulating layer in the peripheral area.

In an exemplary embodiment, the power supply lines include a plurality of first power supply lines disposed in the pixel area, and a second power supply line connected to the first power supply lines and disposed in the peripheral area. The second power supply line extends along an edge of the pixel area, and a width of the second power supply line is greater than a width of the first power supply line.

In an exemplary embodiment, the second power supply line overlaps a portion of the data lines.

In an exemplary embodiment, in the pixel area, the scan lines extend substantially in a first direction, and the data lines and the first power supply lines extend substantially in a second direction that crosses the first direction.

In an exemplary embodiment, in the peripheral area, a portion of the scan lines extends in a direction inclined with respect to the first direction.

In an exemplary embodiment, in the peripheral area, a portion of the data lines extends in a direction inclined with respect to the second direction.

In an exemplary embodiment, the scan lines include first bridges disposed on the second insulating layer. The first bridges connect the scan lines disposed below the third insulating layer on the substrate to the scan lines disposed on the third insulating layer.

In an exemplary embodiment, the first bridges are connected to the scan lines disposed below the third insulating layer on the substrate through first contact holes that pass through the first and second insulating layers, and are connected to the scan lines disposed on the third insulating layer through second contact holes that pass through the third insulating layer.

In an exemplary embodiment, the data lines are disposed on the second insulating layer in the pixel area.

In an exemplary embodiment, the data lines include first data lines disposed on the first insulating layer and second data lines disposed below the first data lines on the substrate in the peripheral area.

In an exemplary embodiment, at least a portion of the first data lines and at least a portion of the second data lines extend substantially in parallel with each other.

In an exemplary embodiment, the first data lines and the second data lines are arranged alternately with each other.

In an exemplary embodiment, the first data lines are connected to other data lines disposed on the second insulating layer in the pixel area through contact holes that pass through the second insulating layer.

In an exemplary embodiment, the second data lines are connected to other data lines disposed on the second insulating layer in the pixel area through contact holes that pass through the first and second insulating layers.

In an exemplary embodiment, the power supply lines are disposed on the second insulating layer.

In an exemplary embodiment, the display device further includes a plurality of emission control lines that supply a plurality of emission control signals to the pixels. The emission control lines are disposed below the third insulating layer on the substrate in the pixel area, and are disposed on the third insulating layer in the peripheral area.

In an exemplary embodiment, the display device further includes a scan driver disposed in the peripheral area and connected to end portions of the scan lines, and an emission driver disposed in the peripheral area and connected to end portions of the emission control lines.

In an exemplary embodiment, the scan driver is disposed between the emission driver and the pixel area.

In an exemplary embodiment, the power supply lines include a first power supply line and a second power supply line, and the second power supply line is disposed between an edge of the pixel area and the emission driver.

In an exemplary embodiment, the display device further includes a plurality of additional power supply lines disposed on the third insulating layer in the pixel area and connected to the power supply lines.

In an exemplary embodiment, the additional power supply lines are connected to the power supply lines through a plurality of contact holes that pass through the third insulating layer.

According to an exemplary embodiment of the inventive concept, a display device includes a substrate including a display area and a non-display area, a pixel disposed on the substrate in the display area, a data line that supplies a data signal to the pixel, a scan line that supplies a scan signal to the pixel, a first power supply line that provides a first voltage to the pixel, and first through third insulating layers. The first insulating layer is disposed on the substrate, the second insulating layer is disposed on the first insulating layer, and the third insulating layer is disposed on the second insulating layer. The data line is one of a plurality of data lines, and at least one of the data lines is disposed on the substrate in the non-display area. Data lines other than the at least one data line are disposed on the first insulating layer above the at least one data line disposed on the substrate in the non-display area. The first power supply line is disposed on the second insulating layer, and the scan line is disposed on the third insulating layer.

According to an exemplary embodiment of the inventive concept, a display device includes a substrate including a pixel area and a peripheral area, a plurality of pixels disposed on the substrate in the pixel area, a plurality of data lines that supply a plurality of data signals to the pixels, a plurality of scan lines that supply a plurality of scan signals to the pixels, a plurality of power supply lines that supply a first voltage to the pixels, and first through third insulating layers. The first insulating layer is disposed on the substrate, the second insulating layer is disposed on the first insulating layer, and the third insulating layer is disposed on the second insulating layer. The display device further includes a plurality of emission control lines that supply a plurality of emission control signals to the pixels. The emission control lines are disposed below the third insulating layer on the substrate in the pixel area, and are disposed on the third insulating layer in the peripheral area.

In an exemplary embodiment, the data lines are disposed on the second insulating layer in the pixel area.

In an exemplary embodiment, the data lines include first data lines disposed on the first insulating layer and second data lines disposed below the first data lines on the substrate in the peripheral area.

BRIEF DESCRIPTION OF THE DRAWINGS

The above and other features of the present inventive concept will become more apparent by describing in detail exemplary embodiments thereof with reference to the accompanying drawings, in which:

FIG. 8 is a plan view illustrating a portion P2 of FIG. 4 according to an exemplary embodiment of the inventive concept.

DETAILED DESCRIPTION OF THE EXEMPLARY EMBODIMENTS

Figure 1:
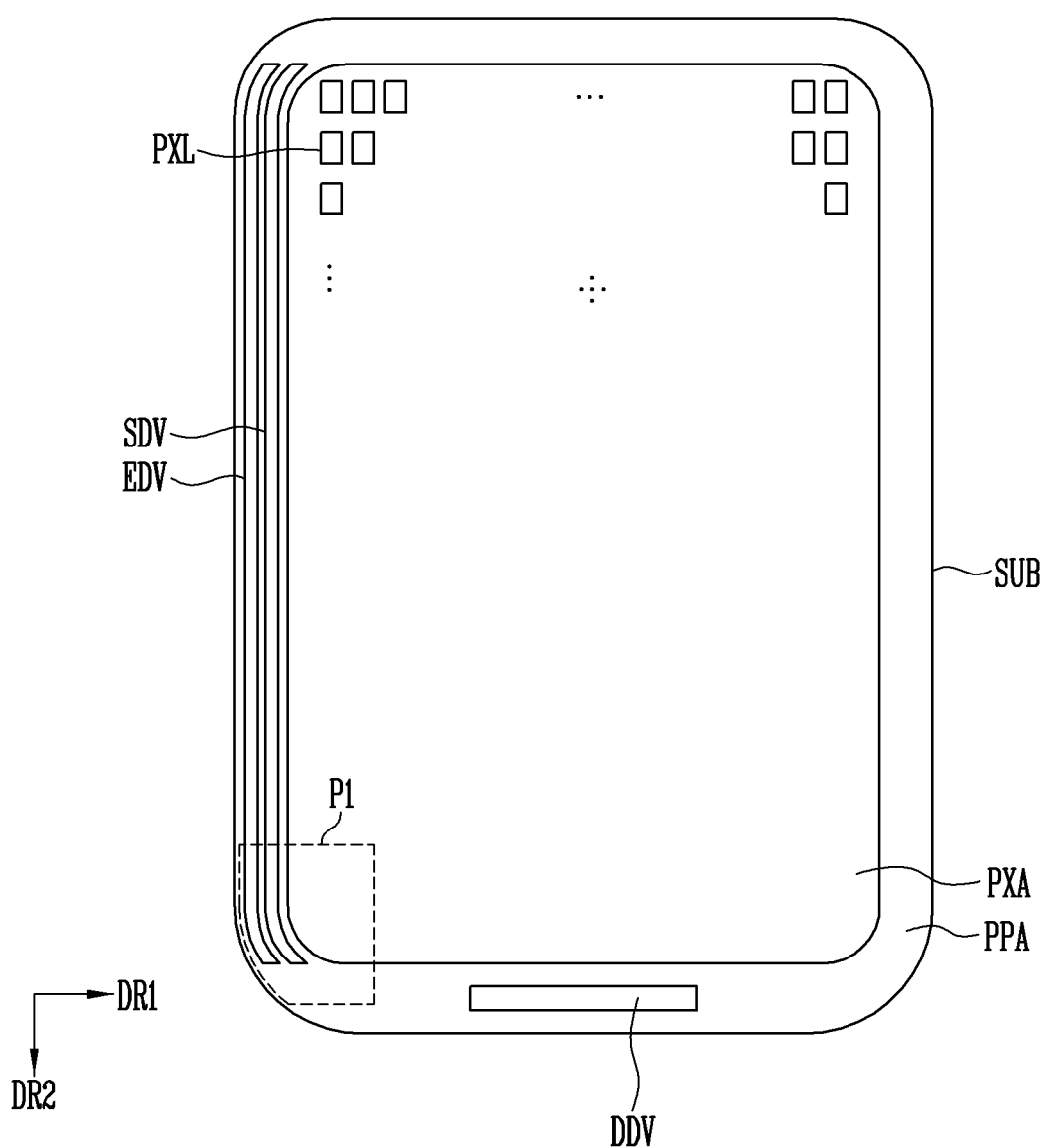
FIG. 1 is a plan view illustrating a display device according to an exemplary embodiment of the inventive concept.

Exemplary embodiments of the present inventive concept will be described more fully hereinafter with reference to the accompanying drawings. Like reference numerals may refer to like elements throughout the accompanying drawings.

It will be understood that the terms "first," "second," "third," etc. are used herein to distinguish one element from another, and the elements are not limited by these terms. Thus, a "first" element in an exemplary embodiment may be described as a "second" element in another exemplary embodiment. Singular expressions used herein include plural expressions unless the context clearly indicates otherwise.

It will be understood that when a component, such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below.

It will be understood that when two components or directions are described as extending substantially parallel or perpendicular to each other, the two components or directions extend exactly parallel or perpendicular to each other, or extend approximately parallel or perpendicular to each other as would be understood by a person having ordinary skill in the art. Further, when processes are described as being performed at substantially the same time, it is to be understood that the processes may be performed at exactly the same time or at about the same time as would be understood by a person having ordinary skill in the art.

FIG. 1 is a plan view illustrating a display device according to an exemplary embodiment of the inventive concept.

Referring to FIG. 1, a display device according to an exemplary embodiment may include a substrate SUB, a plurality of pixels PXL disposed on the substrate SUB, a driving unit disposed on the substrate SUB that drives the pixels PXL, and a wiring unit that connects the pixels PXL and the driving unit to each other.

The substrate SUB may include a single region having a substantially rectangular shape. However, exemplary embodiments of the inventive concept are not limited thereto, and the number of regions included in the substrate SUB may vary. Further, the shape of the substrate SUB may vary depending on the regions included in the substrate SUB. According to an exemplary embodiment, the substrate SUB may include a plurality of regions. When a plurality of regions are included on the substrate SUB, at least two of the plurality of regions may have different areas (e.g., different sizes). For example, the substrate SUB may have two regions having different areas. In an exemplary embodiment, the substrate SUB may have three different regions. In this exemplary embodiment, all three regions may have different areas, or only two of the three regions may have different areas. In an exemplary embodiment, the substrate SUB may have four or more regions.

The substrate SUB may include a pixel area PXA and a peripheral area PPA. The pixel area PXA may also be referred to herein as a display area, and the peripheral area PPA may also be referred to herein as a non-display area. The pixels PXL, which display an image, are disposed in the pixel area PXA. Each of the pixels PXL will be described below. Since the pixels PXL are not disposed in the peripheral area PPA, an image is not displayed in the peripheral area PPA. The driving unit that drives the pixels PXL and some of the wiring lines that connect the pixels PXL to the driving unit may be disposed in the peripheral area PPA. The peripheral area PPA may correspond to a bezel of the display device, and a width of the bezel may be determined by a width of the peripheral area.

The substrate SUB may have various shapes such as, for example, a polygon having a closed shape including straight sides, a circle or an oval including a curved side, and a semi-circle or a semi-oval including straight and curved lines. When the substrate SUB includes a plurality of regions, each of the regions may also have various shapes such as, for example, a polygon having a closed shape including straight sides, a circle or an oval including a curved side, and a semi-circle or a semi-oval including straight and curved lines. It is to be understood that the shapes of the substrate SUB and the plurality of regions described above are exemplary, and the inventive concept is not limited thereto.

When the substrate SUB is disposed in various shapes, at least a portion of the corners of each shape of the substrate SUB may have a curved line. For example, a portion at which neighboring straight sides meet may be a curved line having a predetermined curvature. For example, in an exemplary embodiment, a vertex of a rectangular shape may include a curved side having both ends connected to two adjacent straight sides and having a predetermined curvature. The curvature of the curved line may vary depending on the position. For example, the curvature may vary depending on the location at which the curved line starts, and/or on a length of the curved line. Hereinafter, when referring to the substrate SUB, the corner including the curved line is referred to as a corner portion.

The pixel area PXA may have a shape corresponding to the substrate SUB.

The peripheral area PPA may be disposed near the pixel area PXA. According to an exemplary embodiment, the peripheral area PPA may surround the pixel area PXA, as shown in FIG. 1. According to an exemplary embodiment, the peripheral area PPA may include a horizontal portion extending substantially in a width direction (e.g., direction DR1) and a vertical portion extending substantially in a length direction (e.g., direction DR2). A pair of the vertical portions of the peripheral area PPA may be spaced apart from each other in the width direction (e.g., direction DR1) of the pixel area PXA, and a pair of the horizontal portions of the peripheral area PPA may be spaced apart from each other in the length direction (e.g., direction DR2) of the pixel area PXA.

As described above, the pixels PXL are disposed in the pixel area PXA of the substrate SUB. Each of the pixels PXL is a unit to display an image. Each pixel may include, for example, an organic light emitting device (OLED) that emits white light and/or light having a color other than white (e.g., red, green, blue, cyan, magenta, yellow, etc.).

The pixels PXL may be arranged in a matrix form including a row extending in the first direction DR1 and a column extending in the second direction DR2. However, the arrangement of the pixels PXL is not limited thereto. For example, in an exemplary embodiment, some of the pixels PXL may be arranged in the first direction DR1 as a row direction, and other pixels PXL may be arranged in a direction different from the first direction DR1 (e.g., a direction oblique to the first direction DR1).

The driving unit may provide a signal to each pixel via the wiring unit to control a driving operation of each pixel PXL. The wiring unit is described below.

The driving unit may include a scan driver SDV that provides a scan signal to each pixel via a scan line, an emission driver EDV that provides an emission control signal to each pixel via an emission control line, a data driver DDV that provides a data signal to each pixel via a data line, and a timing controller. The timing controller may control the scan driver SDV, the emission driver EDV, and the data driver DDV.

The scan driver SDV may be disposed in upper and lower portions of the peripheral area PPA. For example, the scan driver SDV may be disposed between the pair of vertical portions of the peripheral area PPA that are spaced apart from each other in the width direction (e.g., the first direction DR1). The scan driver SDV may be disposed in at least one of the upper and lower portions of the peripheral area PPA. The scan driver SDV may extend in the length direction of the peripheral area PPA, as shown in FIG. 1.

According to an exemplary embodiment, the scan driver SDV may be directly mounted on the substrate SUB. In an exemplary embodiment, when the scan driver SDV is directly mounted onto the substrate SUB, the scan driver SDV may be formed during the same step at which the pixels PXL are formed. However, the position and method by which the scan driver SDV is formed is not limited thereto. For example, in an exemplary embodiment, the scan driver SDV may be formed on a separate chip and mounted on the substrate SUB using chip-on-glass (COG) mounting techniques. In an exemplary embodiment, the scan driver SDV may be mounted on a printed circuit board (PCB) and connected to the substrate SUB by a connecting member.

Similar to the scan driver SDV, the emission driver EDV may also be disposed on the vertical portions of the peripheral area PPA, as shown in FIG. 1. The emission driver EDV may be disposed in least one of the vertical portions of the peripheral area PPA. The emission driver EDV may extend in a length direction of the peripheral area PPA, as shown in FIG. 1.

According to an exemplary embodiment, the emission driver EDV may be directly mounted on the substrate SUB. In an exemplary embodiment, when the emission driver EDV is directly mounted on the substrate SUB, the emission driver EDV may be formed at the same time at which the pixels PXL are formed. However, the position and method by which the emission driver EDV is formed is not limited thereto. For example, in an exemplary embodiment, the emission driver EDV may be formed on a separate chip and mounted on the substrate SUB using chip-on-glass (COG) mounting techniques. In an exemplary embodiment, the emission driver EDV may be mounted on a printed circuit board (PCB) and connected to the substrate SUB by a connecting member.

According to the exemplary embodiment shown in FIG. 1, the scan driver SDV and the emission driver EDV are adjacent to each other and are disposed at one of the pair of vertical portions of the peripheral area PPA. However, the inventive concept is not limited thereto. For example, the arrangement of the scan driver SDV and the emission driver EDV may vary. For example, in an exemplary embodiment, the scan driver SDV may be disposed at one of the vertical portions of the peripheral area PPA and the emission driver EDV may be disposed at the other vertical portion of the peripheral area PPA. In an exemplary embodiment, the scan driver SDV may be disposed at both vertical portions of the peripheral area PPA, and the emission driver EDV may be disposed at one of the vertical portions of the peripheral area PPA.

The data driver DDV may be disposed in the peripheral area PPA. The data driver DDV may be disposed in the horizontal portion of the peripheral area PPA. The data driver DDV may extend in the width direction (e.g., the first direction DR1) of the peripheral area PPA.

According to an exemplary embodiment, the positions of the scan driver SDV, the emission driver EDV, and/or the data driver DDV are interchangeable.

The timing controller may be connected to the scan driver SDV, the emission driver EDV, and the data driver DDV through wiring lines by various methods. The position of the timing controller may vary. For example, in an exemplary embodiment, the timing controller may be mounted on a printed circuit board (PCB) and connected to the scan driver SDV, the emission driver EDV, and the data driver DDV through a flexible printed circuit board (PCB). The printed circuit board (PCB) may be disposed at various positions such as, for example, one side of the substrate SUB, or a rear surface of the substrate SUB.

According to an exemplary embodiment, the substrate SUB may have different shapes according to the arrangement of the respective components.

Figure 2:
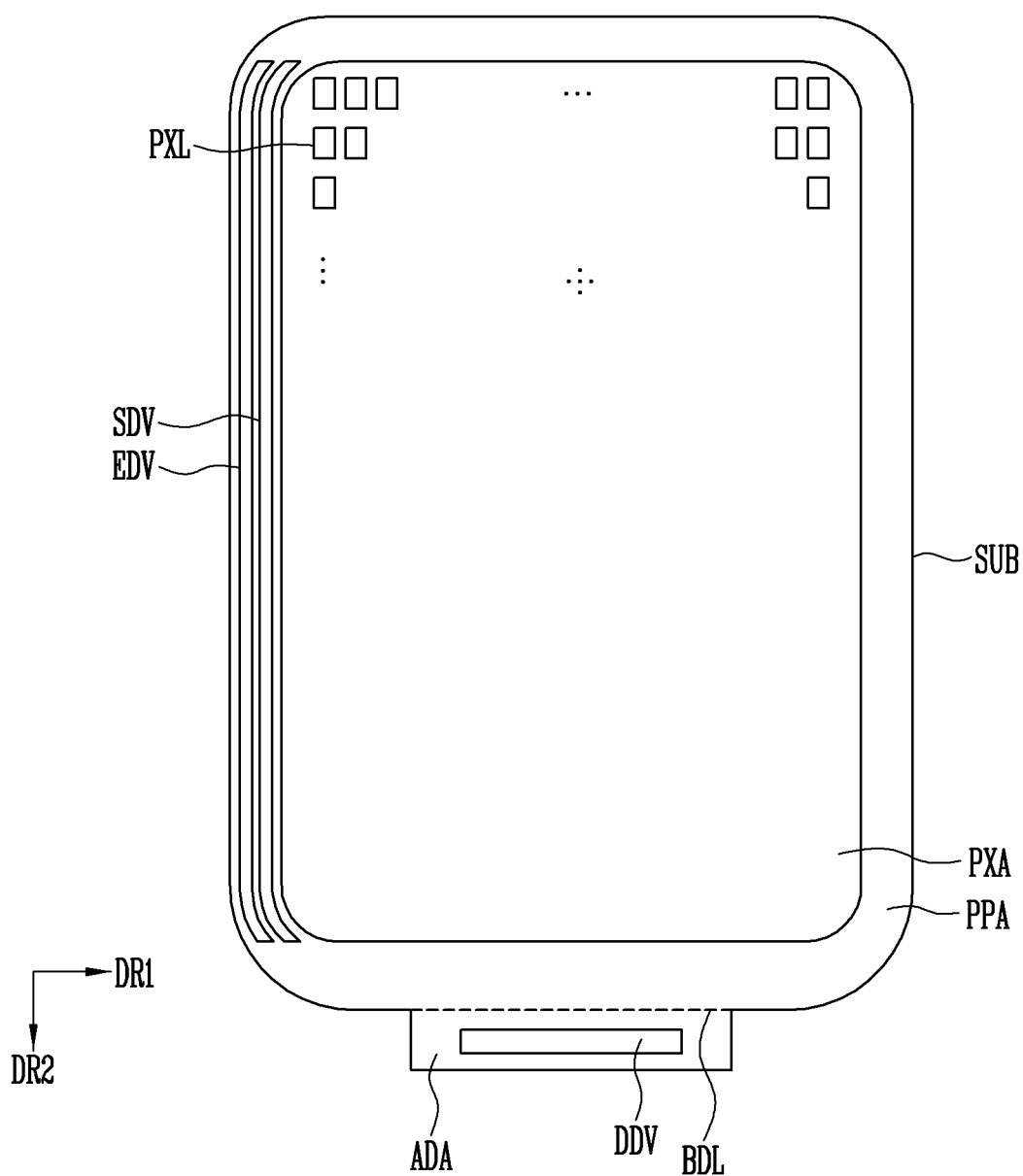
FIG. 2 is a plan view illustrating a display device according to an exemplary embodiment of the inventive concept.

FIG. 2 is a plan view illustrating a display device according to an exemplary embodiment of the inventive concept.

Referring to FIG. 2, a shape of the substrate SUB is different from the shape of the substrate SUB shown in FIG. 1. For example, the substrate SUB shown in FIG. 2 includes an additional area ADA protruding from one side thereof.

According to an exemplary embodiment, the additional area ADA may protrude from the horizontal portion of the peripheral area PPA. Although the additional area ADA is shown in FIG. 2 as protruding from the bottom horizontal portion of the peripheral area PPA, the inventive concept is not limited thereto. For example, in an exemplary embodiment, the additional area ADA may protrude from the upper horizontal portion of the peripheral area PPA. The additional area ADA may be bent along a bending line BDL corresponding to the boundary between the additional area ADA and the horizontal portion. In this example, when the additional area ADA is bent, a width of the bezel at the horizontal portion of the peripheral area PPA may be reduced.

Various components may be arranged in the additional area ADA. For example, the data driver DDV may be disposed in the additional area ADA. However, the components disposed in the additional area ADA are not limited thereto. In exemplary embodiments, the additional area ADA may be disposed in a different part of the peripheral area PPA than the bottom horizontal portion as shown in FIG. 2, and the width of the bezel may also be reduced by bending the additional area ADA.

Figure 3:
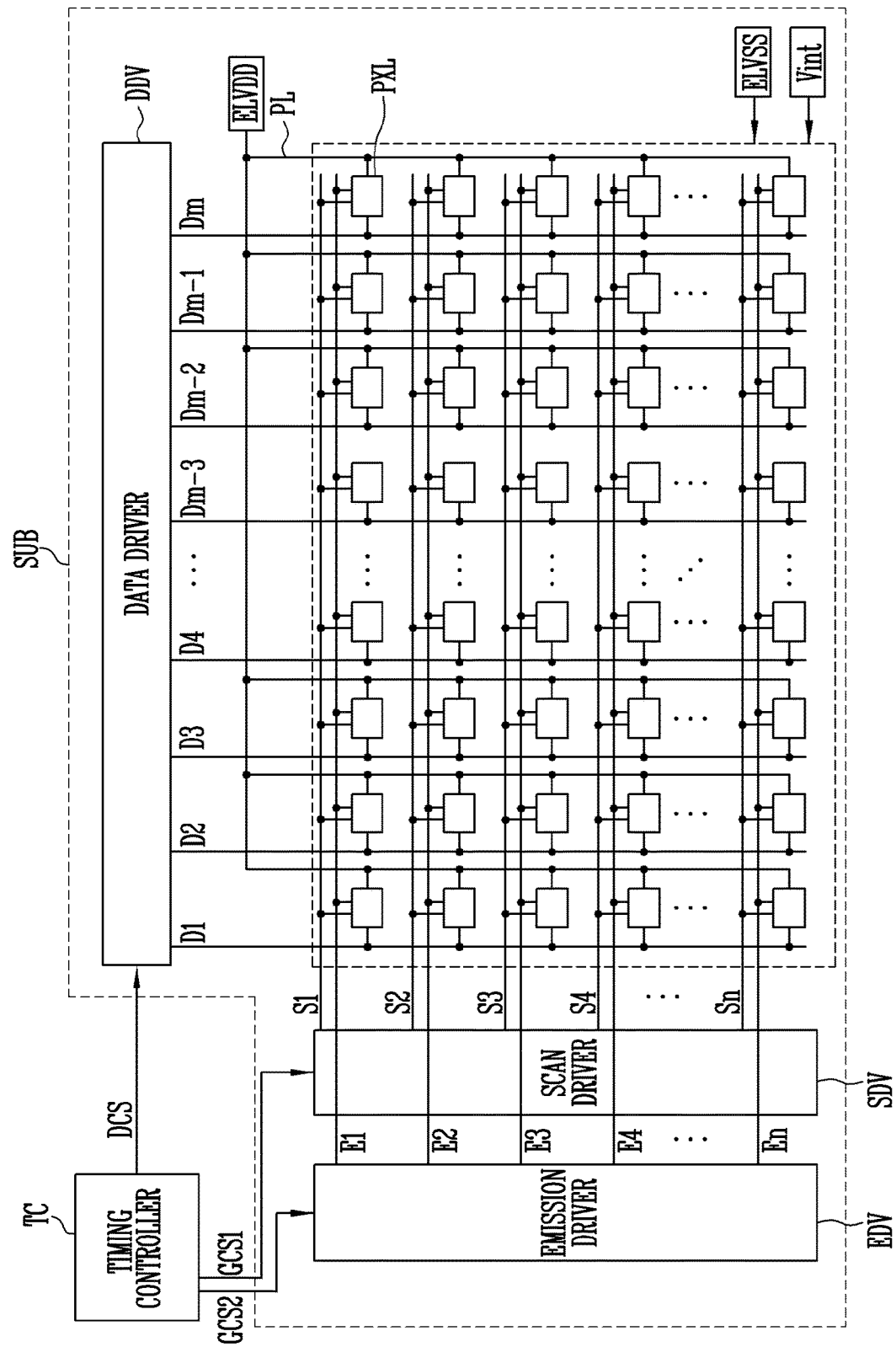
FIG. 3 is a block diagram illustrating components of a display device according to an exemplary embodiment of the inventive concept.

FIG. 3 is block diagram illustrating components of a display device according to an exemplary embodiment of the inventive concept.

Referring to FIG. 3, a display device according to an exemplary embodiment may include the plurality of pixels PXL, the driving unit, and the wiring unit.

The driving unit may include the scan driver SDV, the emission driver EDV, the data driver DDV, and a timing controller TC, as described above. The positions of the scan driver SDV, the emission driver EDV, the data driver DDV, and the timing controller TC shown in FIG. 3 are exemplary, and the positions thereof are not limited thereto. When embodying the actual display device, these positions in the display device may be changed.

The wiring unit may provide a signal to each pixel PXL from the driving unit. The wiring unit may include scan lines, data lines, emission control lines, a power supply line PL and an initialization power supply line. The scan lines may include a plurality of scan lines S1 to Sn, and the emission control lines may include a plurality of emission control lines E1 to En. The data lines D1 to Dm and the power supply line PL may be coupled to each of the pixels PXL.

As described above, the pixels PXL are disposed in the pixel area PXA. The pixels PXL may be coupled to the scan lines S1 to Sn, the emission control lines E1 to En, and the data lines D1 to Dm. The pixels PXL may receive data signals from the data lines D1 to Dm when scan signals are supplied from the scan lines S1 to Sn. The pixels PXL, which receive the data signals, may control the amount of current flowing from a first power supply source ELVDD to a second power supply source ELVSS via, for example, organic light emitting devices (OLEDs).

The scan driver SDV may supply scan signals to the scan lines S1 to Sn in response to a first gate control signal GCS1 received from the timing controller TC. For example, the scan driver SDV may sequentially supply scan signals to the scan lines S1 to Sn. When the scan signals are sequentially supplied to the scan lines S1 to Sn, the pixels PXL may be sequentially selected in units of horizontal lines.

The emission driver EDV may supply emission control signals to the emission control lines E1 to En in response to a second gate control signal GCS2 received from the timing controller TC. For example, the emission driver EDV may sequentially supply emission control signals to the emission control lines E1 to En.

The emission control signal may be set to have a greater width than the scan signal. For example, a emission control signal supplied to an ith emission control line Ei may be supplied to at least partially overlap with periods of a scan signal supplied to an (i−1)th scan line Si−1 and a scan signal supplied to an ith scan line Si.

In addition, the emission control signal may be set to a gate-off voltage (e.g., a high voltage) causing transistors included in the pixels PXL to be turned off, and the scan signal may be set to a gate-on voltage (e.g., a low voltage) causing the transistors included in the pixels PXL to be turned on.

The data driver DDV may supply data signals to the data lines D1 to Dm in response to receiving a data control signal DCS from the timing controller TC. The data signals supplied to the data lines D1 to Dm may be supplied to the pixels PXL selected by the scan signals.

The timing controller TC may supply the gate control signals GCS1 and GCS2, which may be generated on the basis of externally supplied timing signals, to the scan driver SDV and the emission driver EDV, and may supply the data control signal DCS to the data driver DDV.

Each of the gate control signals GCS1 and GCS2 may include a start pulse and clock signals. The start pulse may control the timing of the first scan signal or the first emission control signal. The clock signals may be used to shift the start pulse.

The data control signal DCS may include a source start pulse and clock signals. The source start pulse may control a sampling start point of data. The clock signals may be used to control a sampling operation.

Figure 4:
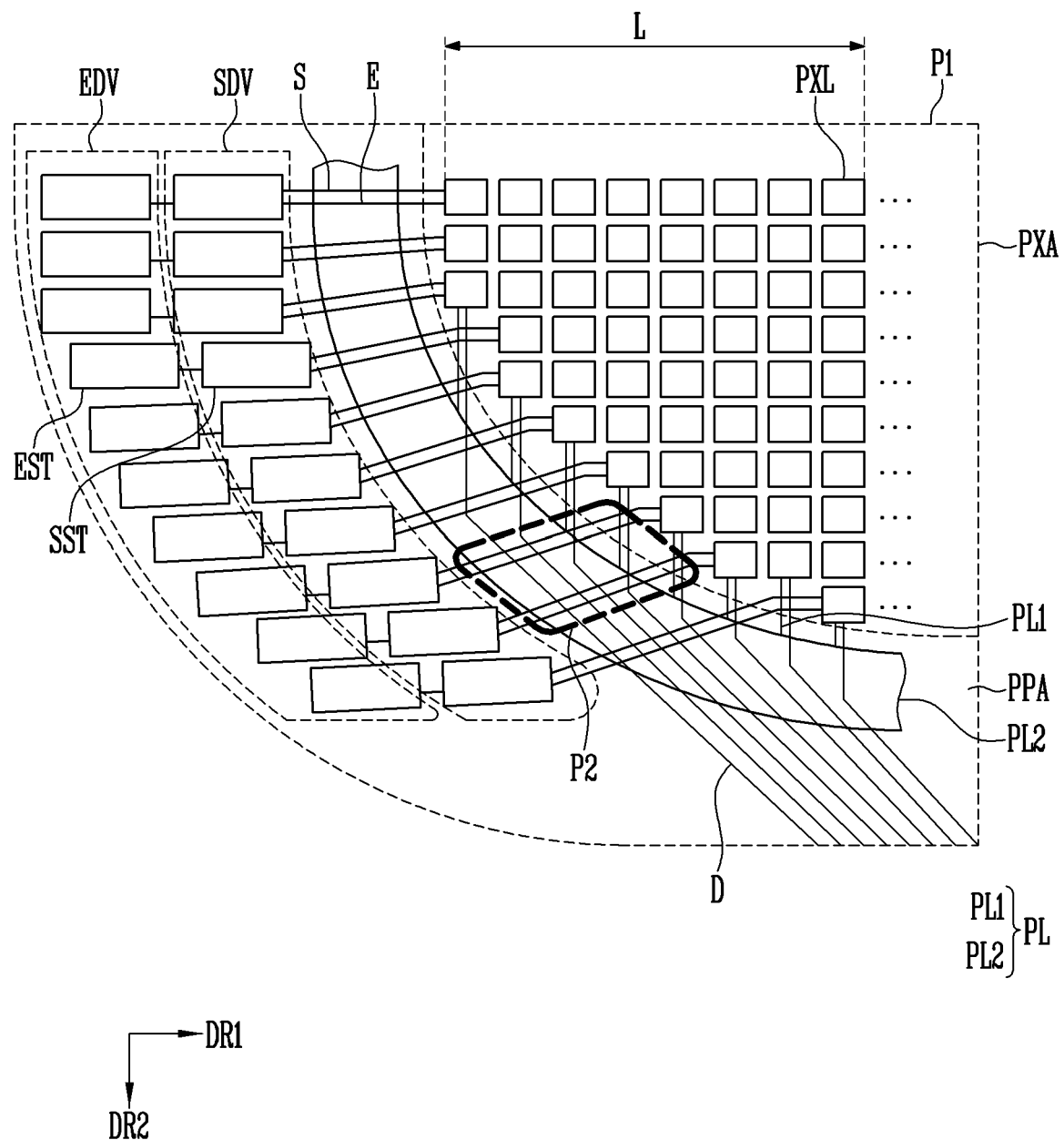
FIG. 4 is a conceptual plan view illustrating a portion P1 of FIG. 1 according to an exemplary embodiment of the inventive concept.

FIG. 4 is a conceptual plan view illustrating a portion P1 of FIG. 1 according to an exemplary embodiment of the inventive concept. FIG. 4 illustrates the connection relationship between pixels, a wiring unit, and a driving unit according to an exemplary embodiment of the inventive concept. The region denoted by P1 in FIG. 1 may include a portion of the lower part of the pixel area PXA and a portion of the lower part of the peripheral area PPA. According to an exemplary embodiment, the portion corresponding to P1 in FIG. 1 is also applicable to FIG. 2.

For convenience of explanation, FIG. 4 illustrates some, but not all of the wiring units, scan lines, emission control lines, data lines, and power supply lines included in a display device according to an exemplary embodiment of the inventive concept. In FIG. 4, one scan line and one emission control line connected to one pixel PXL are referred to as a scan line S and an emission control line E, respectively. In addition, some of the data lines and the power supply lines are referred to as a data line D and a power supply line PL, respectively.

Referring to FIG. 4, the substrate may be divided into the pixel area PXA and the peripheral area PPA. The pixels PXL are disposed in the pixel area PXA.

A plurality of pixel rows may be disposed in the pixel area PXA. The pixels PXL are arranged in the first direction DR1 within each pixel row, and the pixel rows extend in the second direction DR2. A plurality of pixel columns may be disposed in the pixel area PXA. The pixels PXL are arranged in the second direction DR2 within each pixel column, and the pixel columns extend in the first direction DR1. Thus, in an exemplary embodiment, the pixels PXL are arranged in a matrix format.

The pixel area PXA may include straight and curved sides. A corner portion of the pixel area PXA may have a curved side.

When an axis in parallel with the first direction DR1 is an x axis, in another region except for the corner portion of the pixel area PXA, the pixel area PXA may have the same x-axis position of the outermost pixel in each pixel row, the same number of pixels in each pixel row, and the same length of each pixel row in the first direction DR1.

In the corner portion of the pixel area PXA, each pixel row may include a smaller number of pixels relative to the rest of the pixel area PXA. Therefore, when an x-axis position of an outermost pixel of a pixel row at another portion except for the corner portion is determined as a reference position, the x-axis position of the outermost pixel in the pixel row may be distant from the reference position in the second direction DR2. For example, since a length L of the pixel row in the first direction DR1 gradually decreases in the second direction DR2, the corner portion of the pixel region PXA may have a curved shape. Therefore, in the corner portion of the pixel region PXA, the number of pixels PXL in one pixel row may vary. In the corner portion of the pixel region PXA, a pixel row closer to another region except the corner portion may include more pixels PXL.

Although only one portion of the pixel area PXA is illustrated in FIG. 4 for convenience of explanation, the other portion thereof may be formed in substantially the same manner so that the pixel area PXA may have bilateral symmetry. The length of the pixel row arranged in each pixel area may gradually decrease in the second direction DR2. However, in exemplary embodiments, the length may not decrease at the same ratio (or the number of pixels arranged in the pixel row is reduced at the same ratio). The number of pixels arranged in each pixel row may vary depending on the curvature of a curved line forming the corner portion of each pixel area.

The driving unit may be disposed in the peripheral area PPA and the wiring unit may connect the pixels PXL to the driving unit.

The driving unit may include the scan driver SDV connected to the pixels PXL through the scan lines S. The scan driver SDV may be provided adjacent to the pixel area PXA.

According to an exemplary embodiment, the scan driver SDV may include a plurality of scan stages SST. Each scan stage SST may be coupled to one of the scan lines S. Each of the scan lines S may connect an output terminal of the scan stage SST to a scan signal input terminal of the outermost pixel of the pixel row. The scan stages SST may be driven in response to clock signals. The scan stages SST may have substantially the same circuit.

The scan driver SDV may be bent so as to correspond to the corner portion of the pixel area PXA. For example, the scan stages SST may be arranged along the edge of the pixel area PXA. Therefore, an imaginary line connecting an end portion of each of the scan stages SST may be a curved line having a predetermined curvature.

Each of the scan stages SST may correspond to each of the pixel rows provided in the pixel area PXA, and may supply a scan signal to the pixels PXL arranged in the corresponding pixel row.

The scan lines S disposed in the pixel area PXA may be substantially parallel with the first direction DR1. For example, the position of the output terminal of the scan stage SST and the position of the scan signal input terminal of the outermost pixel of the pixel row in the second direction DR2 may coincide with each other.

The scan lines S provided in the peripheral area PPA may be substantially parallel or inclined with respect to the first direction DR1. Since the peripheral area PPA of the corner portion is bent, the scan stages SST may also be arranged along the bent portion of the peripheral area PPA. As a result, the scan lines S provided in the peripheral area PPA may be bent at one portion and inclined at a predetermined angle with respect to the first direction DR1. The positions of the output terminals of the scan stages SST and the positions of the outermost pixels of the pixel rows may be different from each other.

The driving unit may also include the emission driver EDV connected to the pixels PXL. The emission driver EDV may be disposed adjacent to the scan driver SDV. The scan driver SDV may be disposed between the emission driver EDV and the pixel area PXA, so that the emission driver EDV is disposed closer to the outer edge than the scan driver SDV.

According to an exemplary embodiment, the emission driver EDV may include a plurality of light emitting stages EST. The emission control lines E may connect an output terminal of the light emitting stage EST to a light emitting signal input terminal of the outermost pixel of the pixel row. The scan stages SST may be driven in response to clock signals. The light emitting stages EST may have substantially the same circuit.

The emission driver EDV may be bent so as to correspond to the corner portion of the pixel area PXA. For example, an imaginary line connecting an end portion of each of the light emitting stages EST may be a curved line having a predetermined curvature.

Each of the light emitting stages EST may correspond to each of the pixel rows provided in the pixel area PXA, and may supply an emission control signal to the pixels PXL arranged in the corresponding pixel row.

The emission control lines E disposed in the pixel area PXA may extend substantially in parallel with the first direction DR1. For example, the position of the output terminal of the first scan stage SST and the position of the scan signal input terminal of the outermost pixel of the pixel row in the second direction DR2 may coincide with each other.

The emission control lines E provided in the peripheral area PPA may be substantially parallel or inclined with respect to the first direction DR1. One set of ends of the emission control lines E disposed in the peripheral area PPA may be connected to the pixels PXL, and the other set of ends thereof may be connected to the light emitting stages EST. Since the peripheral area PPA corresponding to the corner portion is bent, the light emitting stages EST may also be bent along the bent portion of the peripheral area PPA. As a result, the emission control lines E disposed in the peripheral area PPA may be bent at one portion and inclined at a predetermined angle with respect to the first direction DR1. The positions of the output terminals of the light emitting stages EST and the positions of the scan signal input terminals of the outermost pixels of the pixel rows may be different from each other.

For convenience of explanation, the scan line S is connected to only the outermost pixel of each pixel row in FIG. 4. However the inventive concept is not limited thereto. For example, in exemplary embodiments, the scan line S may be connected to all pixels PXL disposed in each pixel row. In addition, the emission control line E may be connected to all pixels PXL disposed in each pixel row.

The data driver DDV shown in FIG. 1 may be disposed in the peripheral area PPA. Each of the pixel columns may be connected to the data line D corresponding thereto. The data lines D may be connected to the data driver DDV. For convenience of explanation, each of the data lines D is coupled to only the outermost pixel of each pixel column in FIG. 4. However, the inventive concept is not limited thereto. For example, in exemplary embodiments, each of the data lines D may be connected to all pixels PXL disposed in each pixel column. Pixels in the same column may share the same data line. The data lines D may extend in the second direction DR2 in the pixel area PXA. The data lines D may extend substantially in the second direction DR2 in the peripheral area PPA. However, the data lines D may be bent at one portion and extend in a direction inclined with respect to the second direction DR2. The data lines D may extend and gather in a direction of the data driver DDV, and may form a data line fan-out unit spreading from the data driver in a pixel direction.

Each of the pixel columns may be connected to the power supply line PL corresponding thereto. The power supply line PL may include first power supply lines PL1 disposed in the pixel area PXA and a second power supply line PL2 connected to the first power supply lines PL1 and disposed in the peripheral area PPA.

As shown in FIG. 4, in an exemplary embodiment, the second power supply line PL2 may have a greater width than the first power supply lines PL1, and may extend along the edge of the pixel area PXA. The first power supply lines PL1 may be branched off from the second power supply line PL2 and connected to the respective pixel columns. The power supply line PL may provide a first voltage from the first power supply source ELVDD (see FIG. 3) to the pixels PXL. For convenience of explanation, the first power supply lines PL1 is connected to only the outermost pixels of the respective pixel columns in FIG. 4. However, the inventive concept is not limited thereto. For example, in exemplary embodiments, each of the first power supply lines PL1 may be connected to all pixels PXL disposed in each of the pixel columns. Pixels in the same column may share the same first power supply line PL1.

According to an exemplary embodiment, wiring lines applying a second voltage supplied by the second power supply source ELVSS (see FIG. 3) to the edge of the emission driver may be provided.

Figure 5:
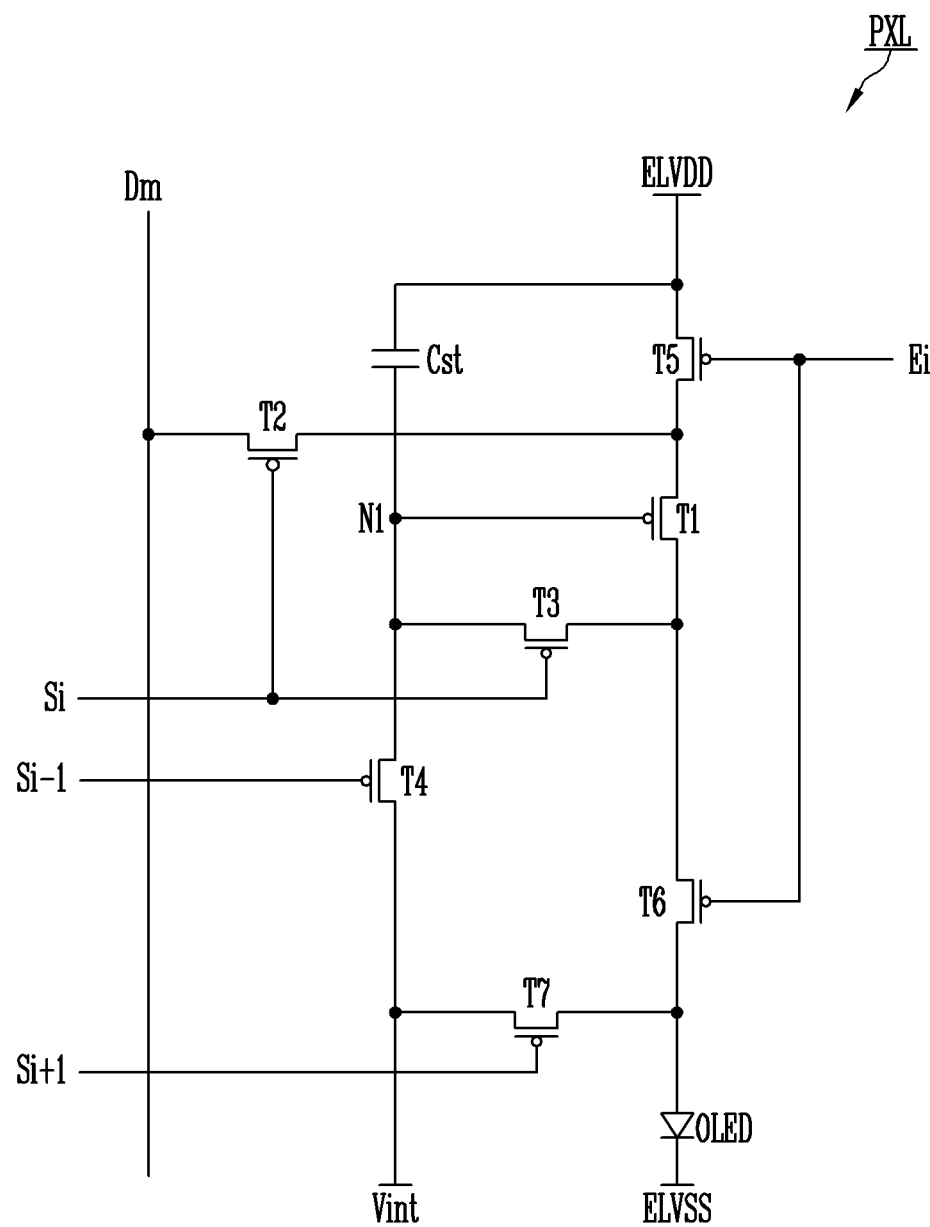
FIG. 5 is a schematic diagram illustrating an exemplary embodiment of a pixel shown in FIG. 4.

FIG. 5 is a schematic diagram illustrating an exemplary embodiment of the pixel PXL shown in FIG. 4. For convenience of explanation, FIG. 5 illustrates a pixel connected to an mth data line Dm and an ith scan line Si.

Referring to FIG. 5, according to an exemplary embodiment, the pixel PXL may include an organic light emitting diode OLED, first to seventh transistors T1 to T7, and a storage capacitor Cst.

An anode of the organic light emitting diode OLED may be connected to the first transistor T1 via the sixth transistor T6, and a cathode thereof may be connected to the second power supply source ELVSS. The organic light emitting diode OLED may generate light with a predetermined brightness corresponding to the amount of current supplied from the first transistor T1.

The first voltage supplied by the first power supply source ELVDD may be set to a greater voltage than the second voltage supplied by the second power supply source ELVSS, causing the current to flow through the organic light emitting diode OLED.

The seventh transistor T7 may be coupled between an initialization power supply Vint and the anode of the organic light emitting diode OLED. In addition, a gate electrode of the seventh transistor T7 may be coupled to an (i+1)th scan line Si+1. The seventh transistor T7 may be turned on when a scan signal is supplied to the (i+1)th scan line Si+1 to supply a voltage of the initialization power supply Vint to the anode of the organic light emitting diode OLED. The initialization power supply Vint may be set to a voltage lower than a data signal.

The sixth transistor T6 may be connected between the first transistor T1 and the organic light emitting diode OLED. In addition, a gate electrode of the sixth transistor T6 may be connected to an ith emission control line Ei. The sixth transistor T6 may be turned off when an emission control signal is supplied to the ith emission control line Ei, and turned on during the remaining period.

The fifth transistor T5 may be coupled between the first power supply source ELVDD and the first transistor T1. In addition, a gate electrode of the fifth transistor T5 may be coupled to the ith emission control line Ei. The fifth transistor T5 may be turned off when the emission control signal is supplied to the ith emission control line Ei, and turned on during the remaining period.

A first electrode of the first transistor T1 (e.g., the driving transistor) may be connected to the first power supply source ELVDD via the fifth transistor T5, and a second electrode thereof may be coupled to the anode of the organic light emitting diode OLED through via sixth transistor T6. In addition, a gate electrode of the first transistor T1 may be connected to a first node N1. The first transistor T1 may control the amount of current flowing from the first power supply source ELVDD through the organic light emitting diode OLED to the second power supply source ELVSS in response to a voltage at the first node N1.

The third transistor T3 may be coupled between a second electrode of the first transistor T1 and the first node N1. In addition, a gate electrode of the third transistor T3 may be connected to the ith scan line Si. The third transistor T3 may be turned on when a scan signal is supplied to the ith scan line Si to electrically connect a second electrode of the first transistor T1 to the first node N1. Therefore, when the third transistor T3 is turned on, the first transistor T1 may be connected as a diode.

The fourth transistor T4 may be connected between the first node N1 and the initialization power supply Vint. In addition, a gate electrode of the fourth transistor T4 may be coupled to an (i−1)th scan line Si−1. The fourth transistor T4 may be turned on when a scan signal is supplied to the (i−1)th scan line Si−1 and may supply a voltage of the initialization power supply Vint to the first node N1.

The second transistor T2 may be coupled between the mth data line Dm and the first electrode of the first transistor T1. In addition, a gate electrode of the second transistor T2 may be coupled to the ith scan line Si. The second transistor T2 may be turned on when a scan signal is supplied to the ith scan line Si to electrically connect the mth data line Dm to the first electrode of the first transistor T1.

The storage capacitor Cst may be coupled between the first power supply source ELVDD and the first node N1. The storage capacitor Cst may store a data signal and a threshold voltage of the first transistor T1.

Figure 6:
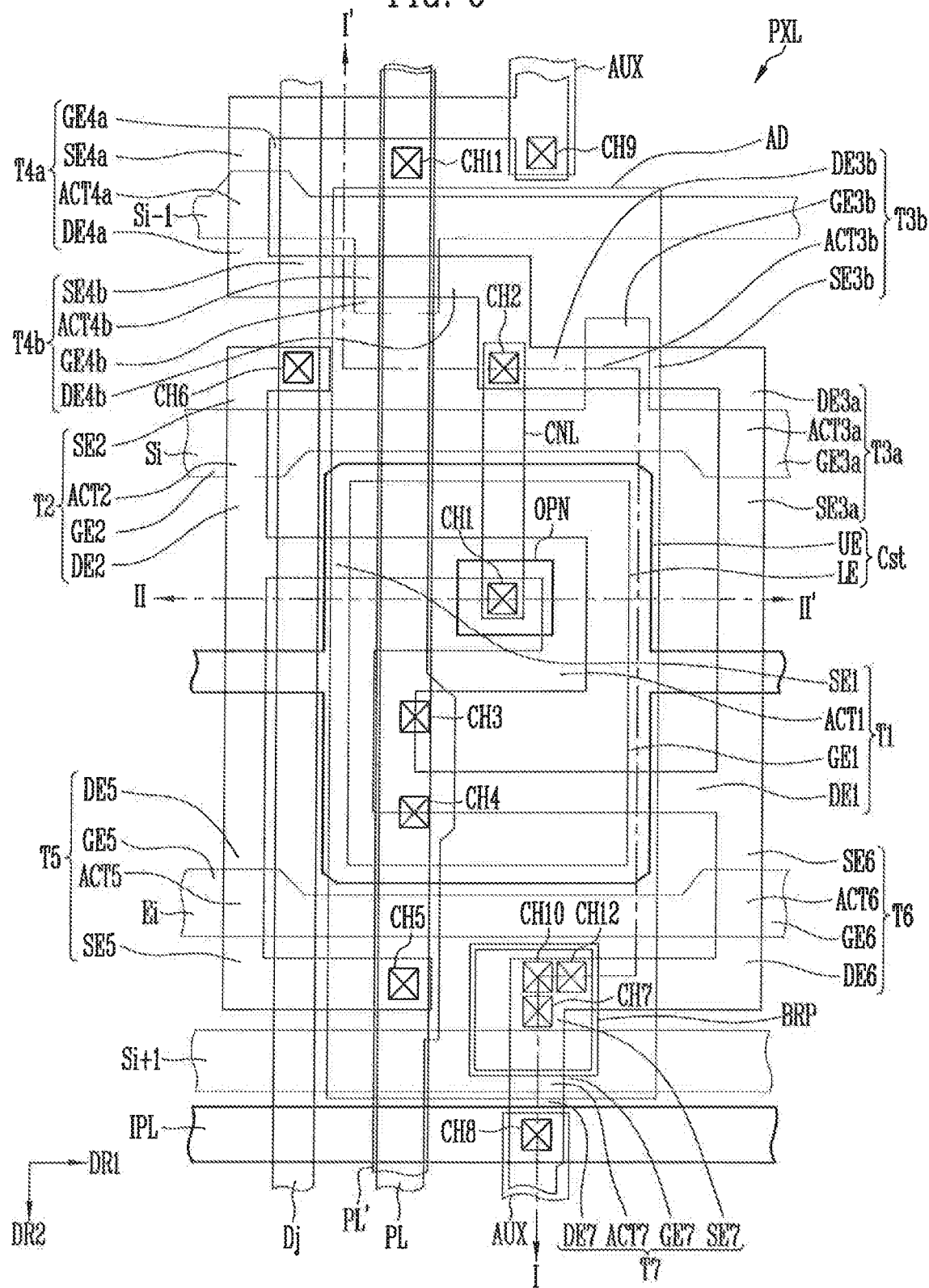
FIG. 6 is a plan view illustrating a pixel shown in FIG. 4 according to an exemplary embodiment of the inventive concept.
Figure 7A:
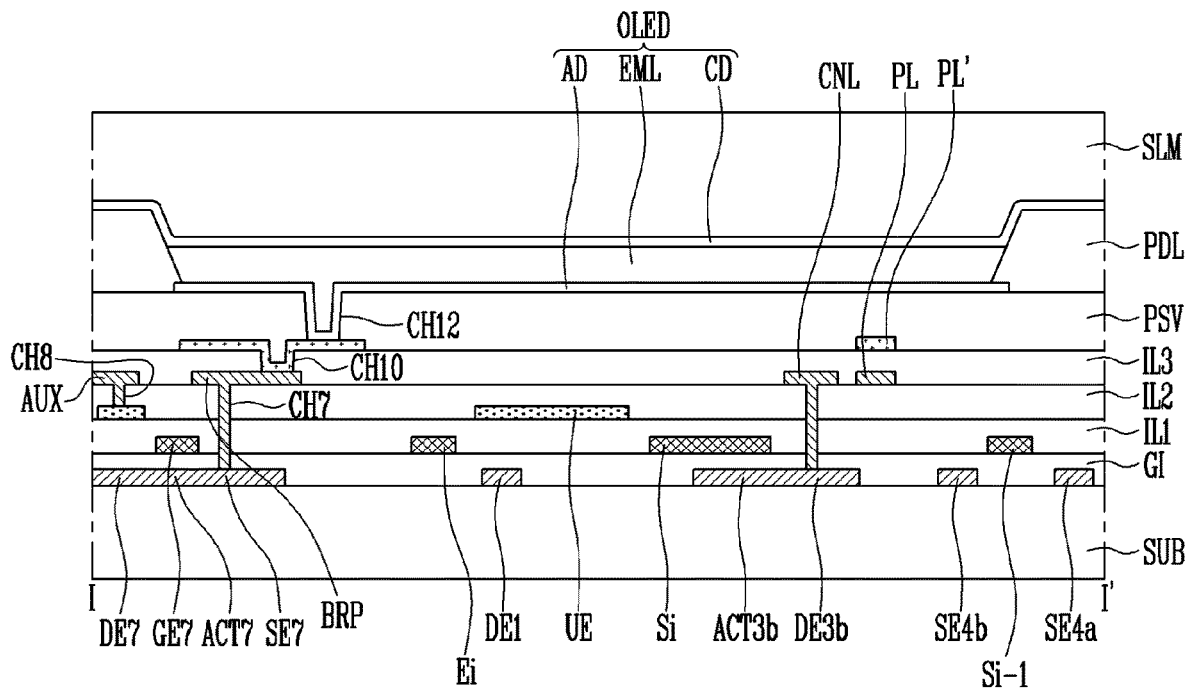
FIG. 7A is a cross-sectional view taken along line I-I' of FIG. 6 according to an exemplary embodiment of the inventive concept.
Figure 7B:
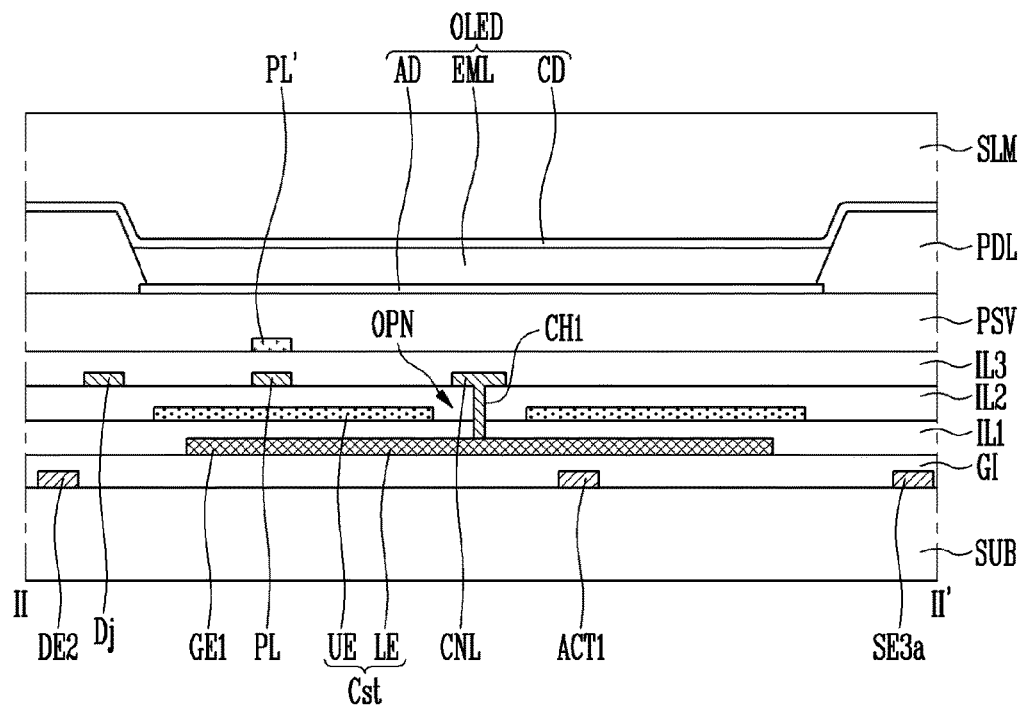
FIG. 7B is a cross-sectional view taken along line II-II' of FIG. 6 according to an exemplary embodiment of the inventive concept.

FIG. 6 is a detailed plan view illustrating the pixel PXL shown in FIG. 4 according to an exemplary embodiment of the inventive concept. FIG. 7A is a cross-sectional view taken along line I-I' of FIG. 6 according to an exemplary embodiment of the inventive concept. FIG. 7B is a cross-sectional view taken along line II-II' of FIG. 6 according to an exemplary embodiment of the inventive concept.

As illustrated in FIGS. 6, 7A and 7B, when one of the pixels PXL arranged in an ith row and a jth column in the pixel area PXA is determined as a reference pixel, the three scan lines Si−1, Si, and Si+1, the emission control line Ei, the power supply line PL, an additional power supply line PL', and a data line Dj, which are coupled to the one pixel PXL, are shown. For convenience of explanation, in FIGS. 7A and 7B, a scan line in an (i−1)th row is referred to as the (i−1)th scan line Si−1, a scan line in the ith row is referred to as the ith scan line Si, a scan line in an (i+1)th row is referred to as an (i+1)th scan line Si+1, an emission control line in the ith row is referred to as the emission control line Ei, a data line in a jth column is referred to as the data line Dj, and a jth power supply line and an additional power supply line are referred to as the power supply line PL and the additional power supply line PL, respectively.

Referring to FIGS. 4 to 6, 7A and 7B, the display device may include the substrate SUB, the wiring unit, and the pixels PXL.

The substrate SUB may include an insulating material such as, for example, glass or resin. In addition, the substrate SUB may include a material having flexibility so that a portion of the substrate SUB may be bent or folded, as described above. The substrate SUB may have, for example, a single-layer structure or a multilayer structure.

For example, the substrate SUB may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. However, the inventive concept is not limited thereto, and the substrate SUB may include various other materials in addition to the above-identified materials. For example, the substrate 100 may include fiber glass reinforced plastic (FRP).

The wiring unit may supply a signal to each pixel PXL and may include the scan lines Si−1, Si, and Si+1. the data line Dj, an emission control line Ej, the power supply line PL, the additional power supply line PL', and an initialization power supply line IPL.

The scan lines Si−1, Si, and Si+1 may extend in the first direction DR1 and may include the (i−1)th scan line Si−1, the ith scan line Si, and the (i+1)th scan line Si+1, which are sequentially arranged in the second direction DR2. Scan signals may be applied to the scan lines Si−1, Si, and Si+1. For example, the (i−1)th scan signal may be applied to the (i−1)th scan line Si−1, the ith scan signal may be applied to the scan line Si, and the (i+1)th scan signal may be applied to the (i+1)th scan line Si+1.

The emission control line Ei may extend in the first direction DR1 and may be separated from the ith scan line Si and the (i+1)th scan line Si+1 between the ith scan line Si and the (i+1)th scan line Si+1. A emission control signal may be applied to the emission control line Ei.

The data line Dj may extend in the second direction DR2 and may be sequentially arranged in the first direction DR1. A data signal may be applied to the data line Dj.

The power supply line PL may extend in the second direction DR2 and may be separated from the data line Dj. The first voltage supplied by the first power supply source ELVDD may be applied to the power supply line PL.

The additional power supply line PL' may overlap the power supply line PL and may be connected to the power supply line PL. As a result, the same first voltage supplied by the first power supply source ELVDD may be applied thereto through an eleventh contact hole CH11.

The initialization power supply line IPL may extend in the first direction DR1 and may be provided between the (i+1)th scan line Si+1 and the (i−1)th scan line Si−1 of a pixel in the next row. The initialization power supply Vint may be applied to the initialization power supply line IPL.

Each pixel PXL may include first to seventh transistors T1 to T7, the storage capacitor Cst, and the light emitting device OLED.

The first transistor T1 may include a first gate electrode GE1, a first active pattern ACT1, a first source electrode SE1, a first drain electrode DE1, and a connection line CNL.

The first gate electrode GE1 may be coupled to a third drain electrode DE3 (e.g., DE3a/DE3b) of the third transistor T3 (e.g. T3a/T3b) and a fourth drain electrode DE4 (e.g., DE4a/DE4b) of the fourth transistor T4 (e.g., T4a/T4b). The connection line CNL may connect the first gate electrode GE1, the third drain electrode DE3 and the fourth drain electrode DE4 to one another. One end of the connection line CNL may be connected to the first gate electrode GE1 through a first contact hole CH1. The other end of the connection line CNL may be connected to the third drain electrode DE3 and the fourth drain electrode DE4 through a second contact hole CH2.

According to an exemplary embodiment, each of the first active pattern ACT1, the first source electrode SE1, and the first drain electrode DE1 may include a semiconductor layer doped or undoped with impurities. Each of the first source electrode SE1 and the first drain electrode DE1 may include a semiconductor layer doped with impurities. The first active pattern ACT1 may include a semiconductor layer doped with no impurities.

The first active pattern ACT1 may have, for example, a bar shape extending in a predetermined direction, and may be bent several times in a length direction. As viewed in the plane, the first active pattern ACT1 may overlap with the first gate electrode GE1. Since the first active pattern ACT1 is formed to have a relatively large length, a channel region of the first transistor T1 may have a relatively large length. Therefore, a driving range of a gate voltage applied to the first transistor T1 may be widened. As a result, grayscale levels of light emitted from the organic light emitting device OLED may be finely controlled.

The first source electrode SE1 may be connected to one end of the first active pattern ACT1, a second drain electrode DE2 of the second transistor T2, and a fifth drain electrode DE5 of the fifth transistor T5. The first drain electrode DE1 may be connected to the other end of the first active pattern ACT1, a third source electrode SE3 (e.g., SE3a/SE3b) of the third transistor T3 (e.g., T3a/T3b), and a sixth source electrode SE6 of the sixth transistor T6.

The second transistor T2 may include a second gate electrode GE2, a second active pattern ACT2, a second source electrode SE2, and the second drain electrode DE2.

The second gate electrode GE2 may be connected to the ith scan line Si. The second gate electrode GE2 may be disposed as a portion of the ith scan line Si or may protrude from the ith scan line Si. According to an exemplary embodiment, each of the second active pattern ACT2, the second source electrode SE2, and the second drain electrode DE2 may include a semiconductor layer doped or undoped with impurities. Each of the second source electrode SE2 and the second drain electrode DE2 may include a semiconductor layer doped with impurities. The second active pattern ACT2 may include a semiconductor layer not doped with impurities. The second active pattern ACT2 may correspond to an overlapping portion with the second gate electrode GE2. One end of the second source electrode SE2 may be connected to the second active pattern ACT2, and the other end thereof may be connected to the data line Dj through a sixth contact hole CH6. One end of the second drain electrode DE2 may be connected to the second active pattern ACT2, and the other end thereof may be connected to the first source electrode SE1 of the first transistor T1 and the fifth drain electrode DE5 of the fifth transistor T5.

The third transistor T3 may have a dual gate structure. As a result, leakage current may be prevented or reduced. For example, the third transistor T3 may include a 3a-th transistor T3a and a 3b-th transistor T3b. The 3a-th transistor T3a may include a 3a-th gate electrode GE3a, a 3a-th active pattern ACT3a, a 3a-th source electrode SE3a, and a 3a-th drain electrode DE3a. The 3b-th transistor T3b may include a 3b-th gate electrode GE3b, a 3b-th active pattern ACT3b, a 3b-th source electrode SE3b, and a 3b-th drain electrode DE3b. Herein, the 3a-th gate electrode GE3a and the 3b-th gate electrode GE3b may be referred to as the third gate electrode GE3, the 3a-th active pattern ACT3a and the 3b-th active pattern ACT3b may be referred to as the third active pattern ACT3, the 3a-th source electrode SE3a and the 3b-th source electrode SE3b may be referred to as the third source electrode SE3, and the 3a-th drain electrode DE3a and the 3b-th drain electrode DE3b may be referred to as the third drain electrode DE3.

The third gate electrode GE3 may be connected to the ith scan line Si. The third gate electrode GE3 may be disposed as a portion of the ith scan line Si or may protrude from the ith scan line Si. According to an exemplary embodiment, each of the third active pattern ACT3, the third source electrode SE3, and the third drain electrode DE3 may include a semiconductor layer doped or undoped with impurities. Each of the third source electrode SE3 and the third drain electrode DE3 may include a semiconductor layer doped with impurities, and the third active pattern ACT3 may include a semiconductor layer not doped with impurities. The third active pattern ACT3 may correspond to an overlapping portion with the third gate electrode GE3. One end of the third source electrode SE3 may be connected to the third active pattern ACT3, and the other end thereof may be connected to the first drain electrode DE1 of the first transistor T1 and the sixth source electrode SE6 of the sixth transistor T6. One end of the third drain electrode DE3 may be connected to the third active pattern ACT3, and the other end thereof may be connected to the fourth drain electrode DE4 of the fourth transistor T4. The third drain electrode DE3 may also be connected to the connection line CNL and the first gate electrode GE1 of the first transistor T1 through the first contact hole CH1 and the second contact hole CH2.

The fourth transistor T4 may have a dual gate structure. As a result, leakage current may be prevented or reduced. For example, the fourth transistor T4 may include a 4a-th transistor T4a and a 4b-th transistor T4b. The 4a-th transistor T4a may include a 4a-th gate electrode GE4a, a 4a-th active pattern ACT4a, a 4a-th source electrode SE4a, and a 4a-th drain electrode DE4a. The 4b-th transistor T4b may include a 4b-th gate electrode GE4b, a 4b-th active pattern ACT4b, a 4b-th source electrode SE4b, and a 4b-th drain electrode DE4b. Herein, the 4a-th gate electrode GE4a and the 4b-th gate electrode GE4b may be referred to as the fourth gate electrode GE4, the 4a-th active pattern ACT4a and the 4b-th active pattern ACT4b may be referred to as the fourth active pattern ACT4, the 4a-th source electrode SE4a and the 4b-th source electrode SE4b may be referred to as the fourth source electrode SE4, and the 4a-th drain electrode DE4a and the 4b-th drain electrode DE4b may be referred to as the fourth drain electrode DE4.

The fourth gate electrode GE4 may be connected to the (i−1)th scan line Si−1. The fourth gate electrode GE4 may be disposed as a portion of the (i−1)th scan line Si−1, or may protrude from the (i−1)th scan line Si−1. Each of the fourth active pattern ACT4, the fourth source electrode SE4, and the fourth drain electrode DE4 may include a semiconductor layer doped or undoped with impurities. Each of the fourth source electrode SE4 and the fourth drain electrode DE4 may include a semiconductor layer doped with impurities. The fourth active pattern ACT4 may include a semiconductor layer not doped with impurities. The fourth active pattern ACT4 may correspond to an overlapping portion with the fourth gate electrode GE4. One end of the fourth source electrode SE4 may be connected to the fourth active pattern ACT4, and the other end thereof may be connected to the initialization power supply line IPL and a seventh drain electrode DE7 of the seventh transistor T7 of a pixel in the previous row. An auxiliary connection line AUX may be disposed between the fourth source electrode SE4 and the initialization power supply line IPL. One end of the auxiliary connection line AUX may be connected to the fourth source electrode SE4 through a ninth contact hole CH9. The other end of the auxiliary connection line AUX may be connected to the initialization power supply line IPL in the previous row through an eighth contact hole CH8 in the previous row. One end of the fourth drain electrode DE4 may be connected to the fourth active pattern ACT4, and the other end thereof may be connected to the third drain electrode DE3 of the third transistor T3. The fourth drain electrode DE4 may be connected to the connection line CNL and the first gate electrode GE1 of the first transistor T1 through the second contact hole CH2 and the first contact hole CH1.

The fifth transistor T5 may include a fifth gate electrode GE5, a fifth active pattern ACT5, a fifth source electrode SE5, and the fifth drain electrode DE5.

The fifth gate electrode GE5 may be connected to the emission control line Ei. The fifth gate electrode GE5 may be disposed as a portion of the emission control line Ei, or may protrude from the emission control line Ei. Each of the fifth active pattern ACT5, the fifth source electrode SE5 and the fifth drain electrode DE5 may include a semiconductor layer doped or undoped with impurities. Each of the fifth source electrode SE5 and the fifth drain electrode DE5 may include a semiconductor layer doped with impurities. The fifth active pattern ACT5 may include a semiconductor layer not doped with impurities. The fifth active pattern ACT5 may correspond to an overlapping portion with the fifth gate electrode GE5. One end of the fifth source electrode SE5 may be connected to the fifth active pattern ACT5, and the other end thereof may be connected to the power supply line PL through a fifth contact hole CH5. One end of the fifth drain electrode DE5 may be connected to the fifth active pattern ACT5, and the other end thereof may be connected to the first source electrode SE1 of the first transistor T1 and the second drain electrode DE2 of the second transistor T2.

The sixth transistor T6 may include a sixth gate electrode GE6, a sixth active pattern ACT6, the sixth source electrode SE6, and a sixth drain electrode DE6.

The sixth gate electrode GE6 may be connected to the emission control line Ei. The sixth gate electrode GE6 may be disposed as a portion of the emission control line Ei, or may protrude from the emission control line Ei. Each of the sixth active pattern ACT6, the sixth source electrode SE6 and the sixth drain electrode DE6 may include a semiconductor layer doped or undoped with impurities. Each of the sixth source electrode SE6 and the sixth drain electrode DE6 may include a semiconductor layer doped with impurities. The sixth active pattern ACT6 may include a semiconductor layer not doped with impurities. The sixth active pattern ACT6 may correspond to an overlapping portion with the sixth gate electrode GE6. One end of the sixth source electrode SE6 may be connected to the sixth active pattern ACT6, and the other end thereof may be connected to the first drain electrode DE1 of the first transistor T1 and the third source electrode SE3 of the third transistor T3. One end of the sixth drain electrode DE6 may be connected to the sixth active pattern ACT6, and the other end thereof may be connected to a seventh source electrode SE7 of the seventh transistor T7.

The seventh transistor T7 may include a seventh gate electrode GE7, a seventh active pattern ACT7, the seventh source electrode SE7, and the seventh drain electrode DE7.

The seventh gate electrode GE7 may be coupled to the (i+1)th scan line Si+1. The seventh gate electrode GE7 may be disposed as a portion of the (i+1)th scan line Si+1, or may protrude from the (i+1)th scan line Si+1. Each of the seventh active pattern ACT7, the seventh source electrode SE7, and the seventh drain electrode DE7 may include a semiconductor layer doped or undoped with impurities. Each of the seventh source electrode SE7 and the seventh drain electrode DE7 may include a semiconductor layer doped with impurities. The seventh active pattern ACT7 may include a semiconductor layer not doped with impurities. The seventh active pattern ACT7 may correspond to an overlapping portion with the seventh gate electrode GE7. One end of the seventh source electrode SE7 may be connected to the seventh active pattern ACT7, and the other end thereof may be connected to the sixth drain electrode DE6 of the sixth transistor T6. One end of the seventh drain electrode DE7 may be connected to the seventh active pattern ACT7, and the other end thereof may be connected to the initialization power supply line IPL. The seventh drain electrode DE7 may also be connected to the fourth source electrode SE4 of the fourth transistor T4 of a row pixel. The seventh drain electrode DE7 and the initialization power supply line IPL may be connected through the auxiliary line, the eighth contact hole CH8, and the ninth contact hole CH9.

The storage capacitor Cst may include a lower electrode LE and an upper electrode UE. The lower electrode LE may include the first gate electrode GE1 of the first transistor T1.

The upper electrode UE may overlap the first gate electrode GE1, and may cover at least a portion of the lower electrode LE. By increasing an overlapping area between the upper electrode UE and the lower electrode LE, the capacitance of the storage capacitor Cst may be increased. The upper electrode UE may extend in the first direction DR1. According to an exemplary embodiment, a voltage having the same voltage level as that of the first power supply may be applied to the upper electrode UE. The upper electrode UE may have an opening OPN in which the first gate electrode GE1 and the connection line CNL contact each other through the first contact hole CH1.

The organic light emitting device OLED may include an anode AD, a cathode CD, and an emitting layer EML disposed between the anode AD and the cathode CD.

The anode AD may be disposed in a pixel area corresponding to each pixel. The anode AD may be connected to the seventh source electrode SE7 of the seventh transistor T7 and the sixth drain electrode DE6 of the sixth transistor T6 through a seventh contact hole CH7 and a tenth contact hole CH10. A bridge pattern BRP may be disposed between the seventh contact hole CH7 and the tenth contact hole CH10. The bridge pattern BRP may connect the sixth drain electrode DE6 and the seventh source electrode SE7 to the anode AD.

Referring still to FIGS. 6, 7A and 7B, the structure of a display device according to an exemplary embodiment will be described herein according to a stacking order.

First, the active patterns ACT1 to ACT7 (hereinafter referred to as ACT) may be disposed over the substrate SUB. The active patterns may include the first to seventh active patterns ACT1 to ACT7. The first to seventh active patterns ACT1 to ACT7 may include semiconductor materials.

A buffer layer may be disposed between the substrate SUB and the first to seventh active patterns ACT1 to ACT7.

A gate insulating layer GI may be disposed on the substrate SUB on which the first active pattern ACT1 to the seventh active pattern ACT7 are formed. Thus, the gate insulating layer GI may be disposed on the first active pattern ACT1 to the seventh active pattern ACT7.

The (i−1)th to (i+1)th scan line Si−1 to Si+1, the emission control line Ei, the first gate electrode GE1, and the seventh gate electrode GE7 may be disposed on the gate insulating layer GI. The first gate electrode GE1 may be the lower electrode LE of the storage capacitor Cst. The second gate electrode GE2 and the third gate electrode GE3 may be formed integrally with the ith scan line Si. The fourth gate electrode GE4 may be formed integrally with the (i−1)th scan line Si−1. The fifth gate electrode GE5 and the sixth gate electrode GE6 may be formed integrally with the emission control line Ei. The seventh gate electrode GE7 may be formed integrally with the (i+1)th scan line Si+1.

A first insulating layer IL1 may be disposed on the substrate SUB on which the (i−1)th scan line Si−1 is formed.

The upper electrode UE of the storage capacitor Cst and the initialization power supply line IPL may be disposed on the first insulating layer IL1. The upper electrode UE may cover at least a portion of the lower electrode LE and may form the storage capacitor Cst together with the lower electrode LE. The first insulating layer IL1 may be disposed between the upper electrode UE and the lower electrode LE.

A second insulating layer IL2 may be disposed on the substrate SUB on which the upper electrode UE is formed. Thus, the second insulating layer IL2 may be disposed on the upper electrode UE.

The jth data line Dj, the power supply line PL, the connection line CNL, the auxiliary connection line AUX, and the bridge pattern BRP may be disposed on the second insulating layer IL2.

The jth data line Dj may be connected to the second source electrode SE2 through the sixth contact hole CH6, which passes through the first insulating layer IL1, the second insulating layer IL2, and the gate insulating layer GI. The power supply line PL may be connected to the upper electrode UE of the storage capacitor Cst through the third and fourth contact holes CH3 and CH4, which pass through the second insulating layer IL2.

The power supply line PL may be connected to the fifth source electrode SE5 through the fifth contact hole CH5, which passes through the first insulating layer IL1, the second insulating layer IL2, and the gate insulating layer GI.

The connection line CNL may be connected to the first gate electrode GE1 through the first contact hole CH1, which passes through the first insulating layer IL1 and the second insulating layer IL2. The connection line CNL may be connected to the third drain electrode DE3 and the fourth drain electrode DE4 through the second contact hole CH2, which passes through the gate insulating layer GI, the first insulating layer IL1 and the second insulating layer IL2.

The auxiliary connection line AUX may be connected to the initialization power supply line IPL through the eighth contact hole CH8, which passes through the second insulating layer IL2. The auxiliary connection line AUX may be connected to the fourth source electrode SE4 and the seventh drain electrode DE7 in the previous row through the ninth contact hole CH9, which passes through the gate insulating layer GI, the first insulating layer IL1, and the second insulating layer IL2.

The bridge pattern BRP may be a medium disposed between the sixth drain electrode DE6 and the anode AD that electrically connects the sixth drain electrode DE6 to the anode AD. The bridge pattern BRP may be connected to the sixth drain electrode DE6 and the seventh source electrode SE7 through the seventh contact hole CH7, which passes through the gate insulating layer GI, the first insulating layer IL1, and the second insulating layer IL2.

A third insulating layer IL3 may be disposed on the substrate SUB on which the jth data line Dj is formed. The third insulating layer IL3 may be disposed on the power supply line PL, the connection line CNL, the bridge pattern BRP, and the auxiliary connection line AUX.

The additional power supply line PL' may be disposed on the third insulating layer IL3. The additional power supply line PL' may stably supply the first voltage supplied by the first power supply source ELVDD to the power supply line PL without delay, and may reduce resistance applied to the power supply line PL. The additional power supply line PL' may extend lengthwise in the second direction DR2 and may overlap the power supply line PL. The additional power supply line PL' may be connected to the power supply line PL through the eleventh contact hole CH11, which passes through the third insulating layer IL3.

A passivation layer PSV may be disposed on the third insulating layer IL3. The additional power supply line PL' may be disposed on the passivation layer PSV.

The anode AD may be disposed on the passivation layer PSV. The anode AD may be connected to the bridge pattern BRP through a twelfth contact hole CH12, which passes through the passivation layer PSV, and the tenth contact hole CH10, which passes through the third insulating layer IL3. Since the bridge pattern BRP is connected to the sixth drain electrode DE6 and the seventh source electrode SE7 through the seventh contact hole CH7, the anode AD may be electrically connected to the sixth drain electrode DE6 and the seventh source electrode SE7.

A pixel defining layer PDL dividing the pixel area PXA so as to correspond to each pixel PXL may be disposed on the substrate SUB on which the anode AD is formed. The pixel defining layer PDL may expose a top surface of the anode AD and may protrude from the substrate SUB along a circumference of the pixel PXL.

The emitting layer EML may be disposed in the pixel area PXA surrounded by the pixel defining layer PDL. The cathode CD may be disposed on the emitting layer EML.

An encapsulating layer SLM may be disposed on the cathode CD. The encapsulating layer may cover the cathode CD.

Figure 9A:
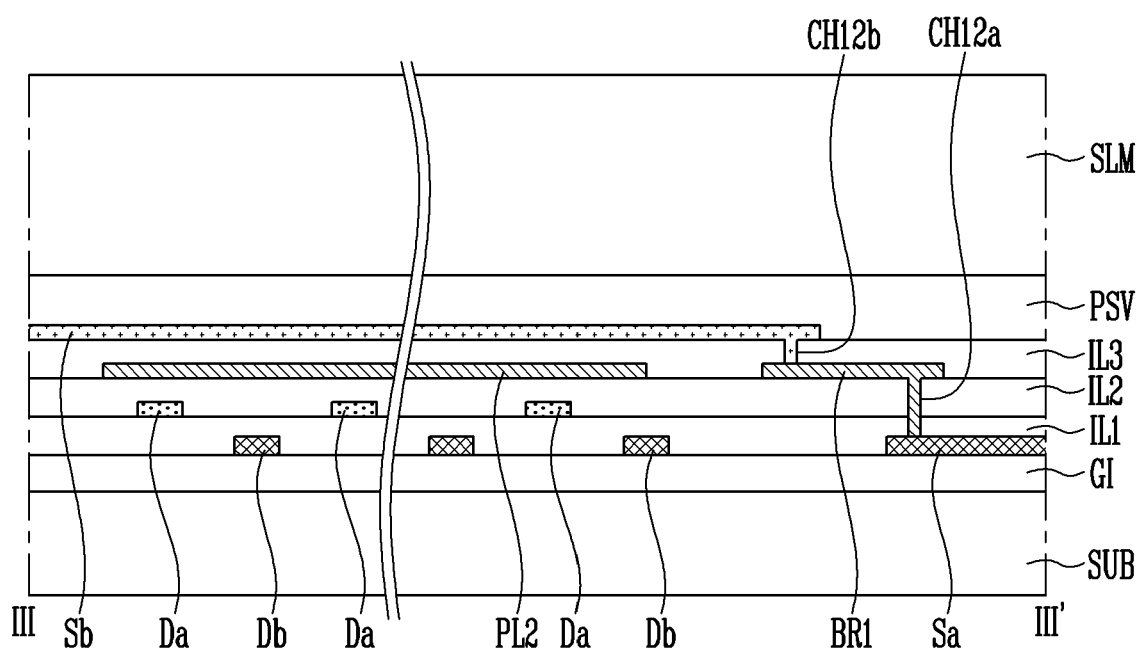
FIG. 9A is a cross-sectional view taken along line III-III' of FIG. 8 according to an exemplary embodiment of the inventive concept.
Figure 9B:
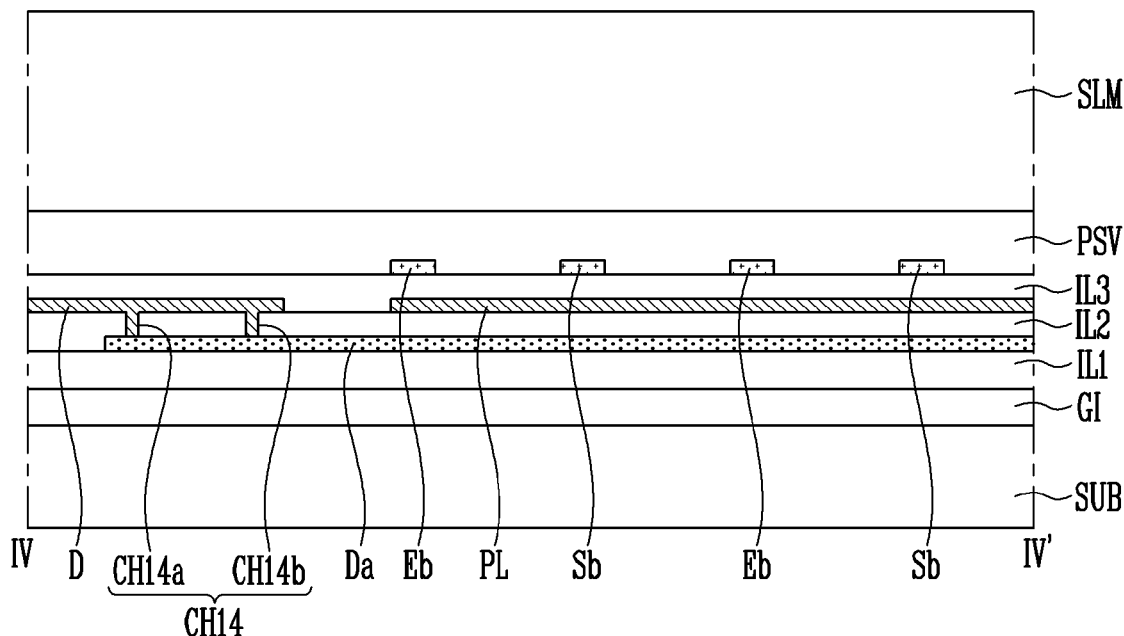
FIG. 9B is a cross-sectional view taken along line IV-IV' of FIG. 8 according to an exemplary embodiment of the inventive concept.
Figure 9C:
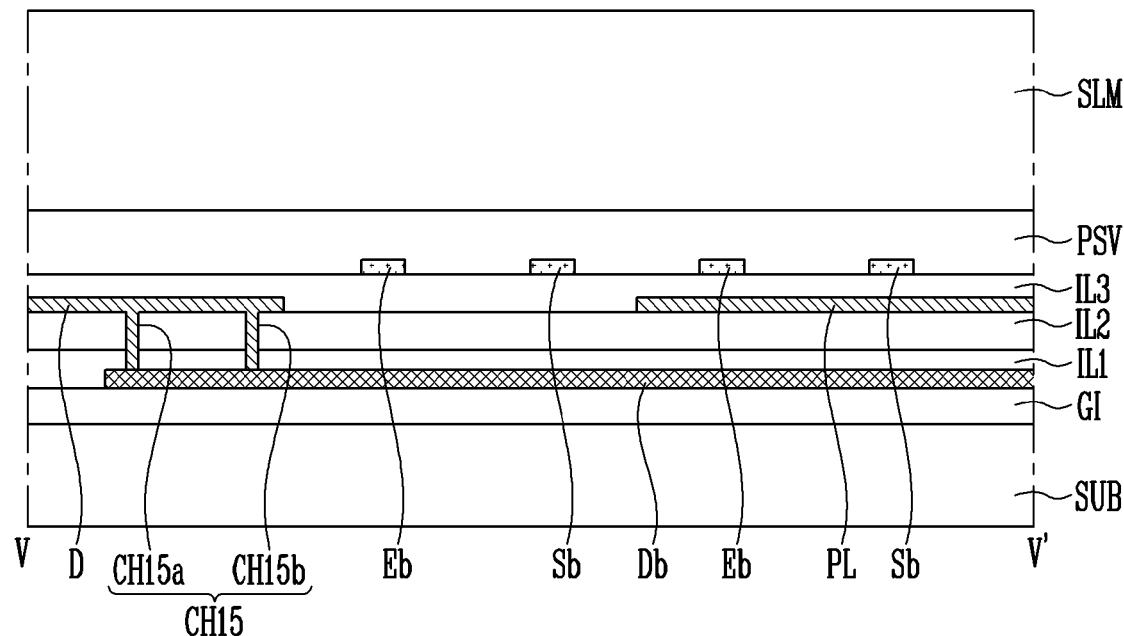
FIG. 9C is a cross-sectional view taken along line V-V' of FIG. 8 according to an exemplary embodiment of the inventive concept.

FIG. 8 is a plan view illustrating a portion P2 of FIG. 4 according to an exemplary embodiment of the inventive concept. FIG. 9A is a cross-sectional view taken along line III-II' of FIG. 8 according to an exemplary embodiment of the inventive concept. FIG. 9B is a cross-sectional view taken along IV-IV' of FIG. 8 according to an exemplary embodiment of the inventive concept. FIG. 9C is a cross-sectional view taken along line V-V' of FIG. 8 according to an exemplary embodiment of the inventive concept.

FIGS. 8 and 9A to 9C illustrate the connection relationship between wiring lines of a display device according to an exemplary embodiment of the inventive concept. For convenience of explanation, some, but not all of the wiring units, scan lines, emission control lines, data lines, and power supply lines included in a display device according to an exemplary embodiment of the inventive concept are illustrated. One scan line connected to one pixel and an emission control line are illustrated and referred to as the scan line S and the emission control line E, respectively. In addition, some of the data lines and the power supply lines are referred to as the data line D and the power supply line PL.

Hereinafter, the connection relationships between respective wiring lines according to an exemplary embodiment of the inventive concept will be described with reference to FIGS. 8 and 9A to 9C.

The scan lines S may extend substantially in the first direction DR1 from the pixel area PXA to (and into) the peripheral area PPA, as shown in FIG. 8. The scan lines S may be bent in a direction inclined with respect to the first direction DR1 and then further extend, depending on their position at the corner portion. FIG. 8 illustrates the scan lines S bent in a direction inclined with respect to the first direction DR1.

The scan lines S may be disposed on the gate insulating layer GI in the pixel area PXA. For example, in an exemplary embodiment, the scan lines S may be directly disposed on and directly contact the gate insulating layer GI in the pixel area PXA. Each of the scan lines S includes a first portion Sa disposed on the gate insulating layer GI, a first bridge BR1 disposed on the second insulating layer IL2, and a second portion Sb disposed on the third insulating layer IL3 in the peripheral area PPA. For example, in an exemplary embodiment, each of the scan lines S includes a first portion Sa disposed directly on the gate insulating layer GI, a first bridge BR1 disposed directly on the second insulating layer IL2, and a second portion Sb disposed directly on the third insulating layer IL3 in the peripheral area PPA. Thus, as shown in FIGS. 8 and 9A, in an exemplary embodiment, the scan line S is disposed below the third insulating layer IL3 on the substrate SUB in the pixel area PXA, and is disposed on the third insulating layer IL3 in the peripheral area PPA.

The first bridge BR1 connects the first portion Sa of the scan line S to the second portion Sb of the scan line S. The first bridge BR1 is connected to the first portion Sa of the scan line S through a 12a-th contact hole CH12a that passes through the first and second insulating layers IL1 and IL2, and to the second portion Sb of the scan line S through a 12b-th contact hole CH12b that passes through the third insulating layer IL3. As shown in FIG. 9A, in an exemplary embodiment, the first bridge BR1 is disposed between the first portion Sa of the scan line S and the second portion Sb of the scan line S.

The emission control lines E may extend substantially in the first direction DR1 from the pixel area PXA into the peripheral area PPA. The emission control lines E may be spaced apart from the scan lines S by a predetermined distance. Some of the emission control lines E may extend substantially in parallel with the scan line S. The emission control lines E may be bent in a direction inclined with respect to the first direction DR1, depending on their position at the corner portion, or may extend in the direction inclined with respect to the first direction DR1. FIG. 8 illustrates an exemplary embodiment in which the emission control lines E are bent with respect to the first direction DR1.

The emission control lines E may be disposed on the same layer as the scan lines S. According to an exemplary embodiment, the emission control lines E are disposed on the gate insulating layer GI in the pixel area PXA, as shown, for example, in FIG. 7A. The emission control lines E may be connected in substantially the same manner as the scan lines S. For example, the emission control line E may include a first portion Ea disposed on the gate insulating layer GI in the pixel area PXA (e.g., see also emission control line Ei in FIG. 7A), a second bridge BR2 disposed on the second insulating layer IL2, and a second portion Eb disposed on the third insulating layer IL3 in the peripheral area PPA. For example, in an exemplary embodiment, the emission control line E may include a first portion Ea disposed directly on the gate insulating layer GI in the pixel area PXA (e.g., see also emission control line Ei in FIG. 7A), a second bridge BR2 disposed directly on the second insulating layer IL2, and a second portion Eb disposed directly on the third insulating layer IL3 in the peripheral area PPA.

The second bridge BR2 may connect the first portion Ea of the emission control line and the second portion Eb of the emission control line E. The second bridge BR2 may be connected to the first portion Ea of the emission control line E through a 13a-th contact hole CH13a that passes through the first and second insulating layers IL1 and IL2, and to the second portion Eb of the emission control line E through a 13b-th contact hole CH13b that passes through the third insulating layer IL3.

The data lines D may extend from the pixel area PXA substantially in the second direction DR2 into the peripheral area PPA. The data lines D may be bent in a direction inclined with respect to the second direction DR2 and then further extend, depending on the position at the corner portion. FIG. 8 illustrates an example in which the data lines D are bent in the direction inclined with respect to the second direction DR2 and extend toward the right side.

In an exemplary embodiment, the data lines D are disposed on the second insulating layer IL2 in the pixel area PXA (see, e.g., Dj in FIG. 7B). In an exemplary embodiment, the data lines D include a first data line Da disposed on the first insulating layer IL1 and a second data line Db disposed on the gate insulating layer GI in the peripheral area PPA.

Some of the data lines D extending from the pixel area PXA may be connected to the first data lines Da through 14a-th and 14b-th contact holes CH14a and CH14b, which pass through the second insulating layer IL2. In an exemplary embodiment, a single contact hole may replace the contact holes CH14a and CH14b. Other data lines D extending from the pixel area PXA may be connected to the second data lines Db through 15a-th and 15b-th contact holes CH15a and CH15b, which pass through the first and second insulating layers IL1 and IL2. In an exemplary embodiment, a single contact hole may replace the contact holes CH15a and CH15b.

The first data lines Da and the second data lines Db may be separated from each other and alternate with each other. At least some of the first data lines Da and the second data lines Db may extend so as to be substantially in parallel with each other.

The power supply line PL may include the first power supply lines PL1 disposed in the pixel area PXA, and the second power supply line PL2 connected to the first power supply line PL1 and disposed in the peripheral area PPA. The first power supply lines PL1 may extend substantially in the second direction DR2 in the pixel area PXA. The second power supply line PL2 may extend along the edge of the pixel area PXA. The first power supply lines PL1 may be branched off from the second power supply line PL2.

The power supply line PL may be disposed on the second insulating layer IL2 in the pixel area PXA and the peripheral area PPA.

Hereinafter, the structure of the wiring unit of the peripheral area PPA will be described according to a stacking order.

First, the gate insulating layer GI may be disposed on the substrate SUB.

A buffer layer may be disposed between the substrate SUB and the gate insulating layer GI.

The first portions Sa of the scan lines S, the first portion Ea of the emission control line E, and the second data lines Db extending from the pixel area PXA may be disposed on the gate insulating layer GI. The first portions Sa of the scan lines S, the first portion Ea of the emission control line E, and the second data lines Db may be formed using the same materials as the scan lines S in the pixel area PXA during the same processes for forming the scan lines S. Therefore, the first portions Sa of the scan lines S, the first portion Ea of the emission control line E, and the second data lines Db may be formed on the same layer as the scan lines S in the pixel area PXA.

The first insulating layer IL1 may be disposed on the substrate SUB on which the first portions Sa of the scan lines S, the first portion Ea of the emission control line E, and the second data lines Db are formed.

The first data lines Da may be disposed on the first insulating layer IL1. The first data lines Da may be formed at substantially the same time as forming the upper electrode and the initialization power supply line IPL of the storage capacitor in the pixel area PXA by performing the same processes using the same materials. Therefore, the first data lines Da may be formed on the same layer as the upper electrode and the initialization power supply line IPL of the storage capacitor in the pixel area PXA.

The second insulating layer IL2 may be disposed on the first insulating layer IL1 on which the first data lines Da are formed.

The first power supply line PL1, the second power supply line PL2, and the first and second bridges BR1 and BR2 may be disposed on the second insulating layer IL2. The first bridge BR1 may be connected to the first portion Sa of the scan line S through the 12a-th contact hole CH12a that passes through the first and second insulating layers IL1 and IL2. The second bridge BR2 may be connected to the first portion Ea of the emission control line E through the 13a-th contact hole CH13a that passes through the first and second insulating layers IL1 and IL2.

The second power supply line PL2 may be formed to have a relatively large width in an extending direction to at least partially cover the first data lines Da and the second data lines Db in the peripheral area PPA.

The first power supply line PL1, the second power supply line PL2, and the first and second bridges BR1 and BR2 may be formed at substantially the same time as forming the data lines D and the power supply lines PL in the pixel area PXA by performing the same processes using the same materials. Therefore, the first power supply line PL, the second power supply line PL2, and the first and second bridges BR1 and BR2 may be formed on the same layer as the data lines D and the power supply lines PL in the pixel area PXA.

The third insulating layer IL3 may be disposed on the second insulating layer IL2 on which the first power supply line PL1, the second power supply line PL2, and the first and second bridges BR1 and BR2 are formed.

The second portion Sb of the scan line S and the second portion Eb of the emission control line E may be disposed on the third insulating layer IL3. The second portion Sb of the scan line S may be connected to the first bridge BR1 through the 12b-th contact hole CH12b that passes through the third insulating layer IL3. The second portion Eb of the emission control line E may be connected to the second bridge BR2 through the 13b-th contact hole CH13b that passes through the third insulating layer IL3.

The second portion Sb of the scan line S and the second portion Eb of the emission control line E may be formed at substantially the same time as forming the additional power supply line PL' in the pixel area PXA by the same processes using the same materials. Therefore, the second portion Sb of the scan line S and the second portion Eb of the emission control line E may be formed on the same layer as the additional power supply line PL' in the pixel area PXA.

The passivation layer PSV may be disposed on the third insulating layer IL3 on which the second portion Sb of the scan line S and the second portion Eb of the emission control line are formed. The encapsulating layer SLM may be disposed on the passivation layer PSV. According to an exemplary embodiment, various layers may be additionally provided between the third insulating layer IL3 and the passivation layer PSV, and between the passivation layer PSV and the encapsulating layer SLM. In exemplary embodiments, the encapsulating layer SLM may be omitted.

According to exemplary embodiments of the inventive concept, when a peripheral area has the above-described wiring structure, a short circuit between respective wiring lines may be prevented. According to exemplary embodiments, since scan lines are formed on a third insulating layer, but not on a gate insulating layer or a first insulating layer, a short circuit between the wiring lines disposed on the second insulating layer and the wiring lines disposed on the third insulating layer may be prevented.

According to a comparative example, data lines may be disposed at the same time as scan lines, and emission control lines may be disposed on a gate insulating layer and/or a first insulating layer in a peripheral area. In an effort to reduce the width of a bezel, the area of the peripheral area may be increasingly reduced in the comparative example. As a result, when the above wiring lines are arranged in the limited peripheral area in the comparative example, neighboring wiring lines may be very close to each other. The narrow distance between the neighboring wiring lines may cause a short circuit in the comparative example.

Referring to the comparative example, when wiring lines are formed on a gate insulating layer and/or a first insulating layer and a second insulating layer is formed thereon, the second insulating layer may have a height that varies depending on the shape of the wiring lines from a surface of the substrate. The gate insulating layer and the first to third insulating layers may have different heights depending on whether wiring lines are formed. For example, the upper surface of the second insulating layer may have a height corresponding to the thickness of the wiring lines and the thickness of the second insulating layer at positions where the wiring lines are formed, and a height corresponding to only the thickness of the second insulating layer at positions where the wiring lines are formed. Therefore, the upper surface of the second insulating layer may have a depression at a position where the wiring lines are not formed. However, when two neighboring wiring lines are very close to each other, the depression may be accordingly formed in the upper surface of the second insulating layer, so that the depression may have a small width.

Subsequently, when a conductive layer is formed and patterned by photolithography so as to form other wiring lines (e.g., wiring lines for providing a first power supply voltage or a second power supply voltage) on the upper surface of the second insulating layer, the conductive layer in the depression may not be completely removed due to the narrow width of the depression. The remaining conductive layer may be a residual that subsequently causes a short circuit between other wiring lines. A short circuit may also occur when the third insulating layer is formed on the upper surface of the second insulating layer and other wiring lines are formed thereon.

According to exemplary embodiments of the inventive concept, by forming the scan lines in the peripheral area on the third insulating layer, the distance between the wiring lines on the gate insulating layer and/or the first insulating layer may be increased. According to exemplary embodiments, since the distance between neighboring wiring lines is increased, a short circuit may be reduced when the second insulating layer and/or the third insulating layer is stacked and wiring lines are formed on each layer.

In addition, according to exemplary embodiments, the respective wiring lines in the peripheral area may be formed using substantially the same processes and materials as those of the wiring lines in the pixel area.

A display device according to exemplary embodiments may be used in various electronic devices. For example, the display device may be used in televisions, laptops, cellular phones, smartphones, smart pads, personal media players (PMPs), personal digital assistants (PDAs), navigation systems, and various types of wearable devices such as smart watches.

The wiring structure in a peripheral area of a display device according to exemplary embodiments of the inventive concept may prevent a short circuit between respective wiring lines.

In addition, according to exemplary embodiments, the respective wiring lines in the peripheral area may be formed using substantially the same processes and materials as those of the wiring lines in the pixel area without performing additional processes.

While the present inventive concept has been particularly shown and described with reference to the exemplary embodiments thereof, it will be understood by those of ordinary skill in the art that various changes in form and detail may be made therein without departing from the spirit and scope of the present inventive concept as defined by the following claims.

What is claimed is:

1. A display device, comprising:
   a pixel area in which an image is displayed;
   a peripheral area in which the image is not displayed, wherein the pixel area and the peripheral area are separated from each other by a first curved line;
   a substrate comprising a corner portion comprising a second curved line;
   a plurality of pixels disposed in the pixel area on the substrate;
   a plurality of data lines that supply data signals to the pixels;
   a plurality of first power supply lines disposed in the pixel area; and
   a second power supply line connected to the first power supply lines and disposed in the corner portion of the peripheral area,
   wherein the plurality of data lines comprise first data lines and second data lines disposed in the corner portion,
   wherein the first data lines comprise a first conductive layer, the second data lines comprise a second conductive layer different from the first conductive layer, the first power supply lines and the second power supply line comprise a third conductive layer different from the first and second conductive layers, and the first conductive layer is disposed between the second conductive layer and the third conductive layer in a cross-sectional view,
   wherein, in the corner portion, the first data lines and the second data lines are alternately arranged with each other in the cross-sectional view such that the first data lines do not overlap the second data lines in the cross-sectional view,
   wherein, in the corner portion, the first power supply lines are branched off from the second power supply line, the first power supply lines are disposed between the first data lines and the second data lines in a plan view,
   wherein, in the corner portion, the second power supply line covers the first data lines and the second data lines, and
   wherein the first curved line and the second power supply line have a same curvature.

2. The display device of claim 1, wherein a number of pixels of a first pixel row of the corner portion is different from a number of pixels of a second pixel row of the corner portion.

3. The display device of claim 1, wherein the first power supply lines and the second power supply line supply a first voltage to the pixels.

4. The display device of claim 1, wherein the second power supply line extends along the second curved line of the corner portion.

5. The display device of claim 1, wherein a width of the second power supply line is greater than a width of the first power supply line.

6. The display device of claim 1, wherein the data lines further comprise pixel data lines electrically connecting the first data lines and the second data lines to the pixels.

7. The display device of claim 1, wherein the data lines are bent at one portion in the corner portion.

8. The display device of claim 7, wherein the second power supply line covers the one portion where the data lines are bent.

9. The display device of claim 1, further comprising:
   a scan driver that supplies scan signals to the pixels; and
   scan lines electrically connecting the scan driver and the pixels.

10. The display device of claim 9, wherein the scan driver is disposed along the second curved line of the corner portion.

11. The display device of claim 9, wherein the scan lines are bent at one portion in the corner portion.

12. The display device of claim 9, wherein the scan lines comprise first portions, second portions, and bridges connecting the first portions and the second portions.

13. The display device of claim 12, wherein the second portions of the scan lines overlap the second power supply line.

14. The display device of claim 12, wherein the second portions of the scan lines are bent at one portion in the corner portion.

* * * * *